United States Patent
More

(10) Patent No.: US 11,355,587 B2
(45) Date of Patent: Jun. 7, 2022

(54) SOURCE/DRAIN EPI STRUCTURE FOR DEVICE BOOST

(71) Applicant: Taiwan Semiconductor Manufacturing Co., Ltd., Hsinchu (TW)

(72) Inventor: Shahaji B. More, Hsinchu (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 17/106,389

(22) Filed: Nov. 30, 2020

(65) Prior Publication Data
US 2022/0045169 A1    Feb. 10, 2022

Related U.S. Application Data

(60) Provisional application No. 63/062,046, filed on Aug. 6, 2020.

(51) Int. Cl.
| | |
|---|---|
| *H01L 29/08* | (2006.01) |
| *H01L 29/78* | (2006.01) |
| *H01L 29/66* | (2006.01) |
| *H01L 29/165* | (2006.01) |

(Continued)

(52) U.S. Cl.
CPC ........ *H01L 29/0847* (2013.01); *H01L 29/165* (2013.01); *H01L 29/66795* (2013.01); *H01L 29/785* (2013.01); *H01L 21/0262* (2013.01); *H01L 21/02532* (2013.01);

(Continued)

(58) Field of Classification Search
None
See application file for complete search history.

(56) References Cited

U.S. PATENT DOCUMENTS

| 8,836,016 B2 | 9/2014 | Wu et al. |
| 8,841,701 B2 | 9/2014 | Lin et al. |
| 8,847,293 B2 | 9/2014 | Lee et al. |

(Continued)

OTHER PUBLICATIONS

US 9,825,038 B2, 11/2017, Lee et al. (withdrawn)

(Continued)

*Primary Examiner* — Ali Naraghi
(74) *Attorney, Agent, or Firm* — Haynes and Boone, LLP

(57) ABSTRACT

A method includes providing a substrate, a semiconductor fin extending from the substrate, and a gate structure over the substrate and engaging the semiconductor fin; etching the semiconductor fin to form a source/drain trench; and epitaxially growing a source/drain feature in the source/drain trench, which includes epitaxially growing a first semiconductor layer having silicon germanium (SiGe); epitaxially growing a second semiconductor layer having SiGe above the first semiconductor layer; epitaxially growing a third semiconductor layer having SiGe over the second semiconductor layer; and epitaxially growing a fourth semiconductor layer having SiGe and disposed at a corner portion of the source/drain feature where the source/drain feature has a largest lateral dimension. Each of the first, second, third, and fourth semiconductor layers includes a p-type dopant, and the fourth semiconductor layer has a higher dopant concentration of the p-type dopant than each of the first, second, and third semiconductor layers.

20 Claims, 18 Drawing Sheets

(51) Int. Cl.
    *H01L 21/02*     (2006.01)
    *H01L 29/167*     (2006.01)

(52) U.S. Cl.
    CPC .. *H01L 21/02579* (2013.01); *H01L 21/02636* (2013.01); *H01L 29/167* (2013.01)

(56) References Cited

U.S. PATENT DOCUMENTS

| | | |
|---|---|---|
| 8,853,025 B2 | 10/2014 | Zhang et al. |
| 8,962,400 B2 | 2/2015 | Tsai et al. |
| 9,093,514 B2 | 7/2015 | Tsai et al. |
| 9,236,267 B2 | 1/2016 | De et al. |
| 9,245,805 B2 | 1/2016 | Veh et al. |
| 9,287,382 B1 | 3/2016 | Lee et al. |
| 9,520,482 B1 | 12/2016 | Chang et al. |
| 9,576,814 B2 | 2/2017 | Wu et al. |
| 10,164,048 B1 | 12/2018 | More et al. |
| 10,347,762 B1* | 7/2019 | Liu .................. H01L 29/66545 |
| 10,396,156 B2 | 8/2019 | Tsai et al. |
| 10,468,500 B1 | 11/2019 | Tsai et al. |
| 10,522,359 B2* | 12/2019 | Huang .............. H01L 29/66795 |
| 2019/0097051 A1* | 3/2019 | Tsai .................. H01L 29/66795 |
| 2019/0165099 A1* | 5/2019 | Chen .................... H01L 21/324 |
| 2019/0393308 A1* | 12/2019 | Lo ..................... H01L 21/02576 |

OTHER PUBLICATIONS

Virginia Semiconductor, Inc., Basic Crystallographic Definitions and Properties of Si, SiGe, and Ge, Jun. 2002, 9 pages, Fredericksburg, Virginia.

\* cited by examiner

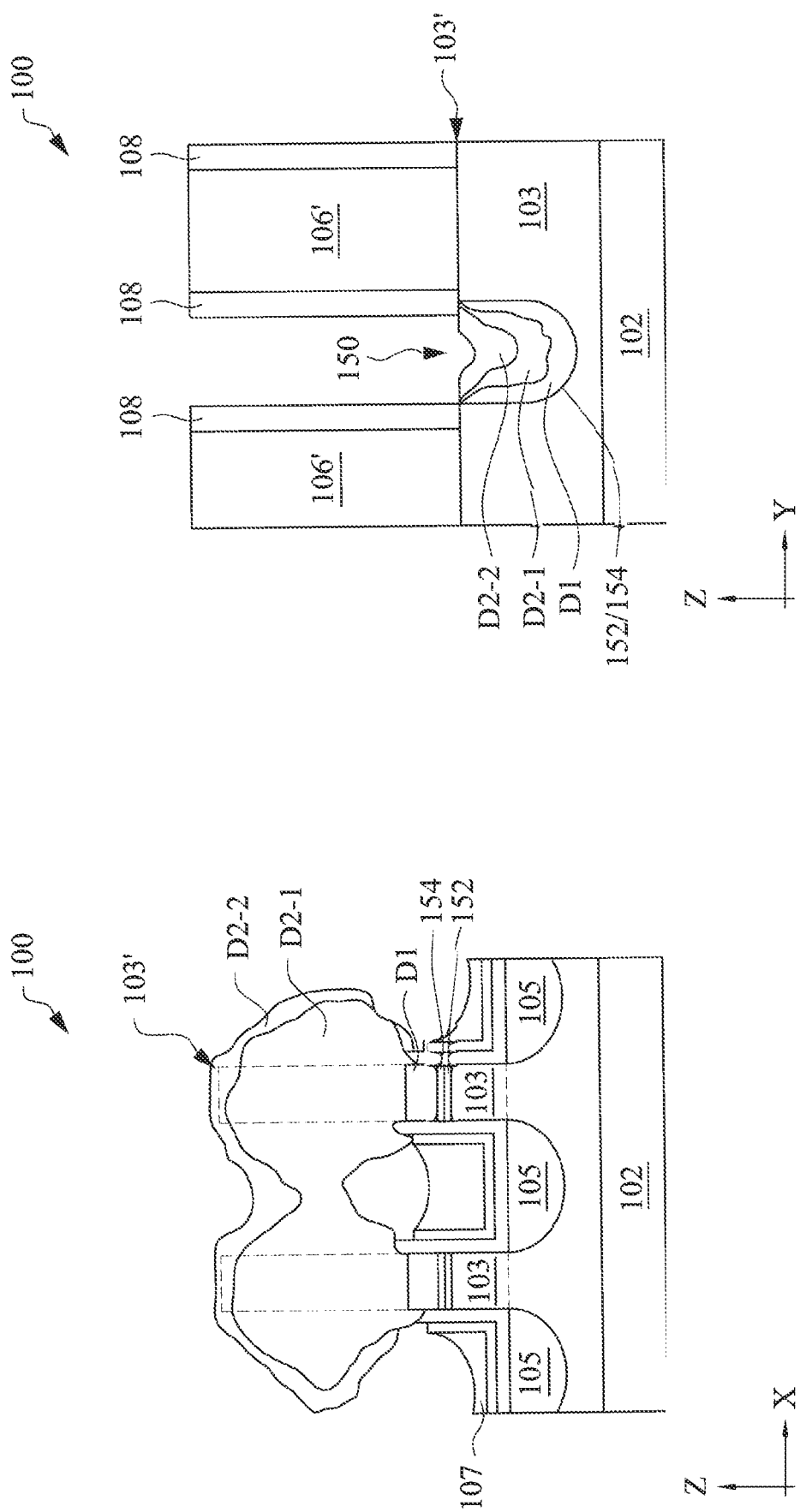

SOURCE/DRAIN EPI STRUCTURE FOR DEVICE BOOST

PRIORITY

The present application claims the benefits of and priority to U.S. Provisional Application No. 63/062,046, entitled "Source/drain EPI Structure for Device Boost," filed Aug. 6, 2020, herein incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advancements to be realized, similar developments in IC processing and manufacturing are needed.

For example, when the scaling down continues, source/drain (S/D) contact resistance becomes more and more dominant in overall transistor resistance. Methods and structures for reducing S/D contact resistance and forming high-quality S/D features are highly desired.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 3A, 4A, 5A, 6A, 7A, 8A, 9A, 10, 11, 12, and 13 are cross-sectional views of a portion of an embodiment of the semiconductor device in FIG. 1A along the A-A line in FIG. 1A, during various manufacturing stages according to the method in FIGS. 2A-2B in accordance with embodiments of the present disclosure.

FIGS. 3B, 4B, 5B, 6B, 7B, 8B, and 9B are cross-sectional views a portion of an embodiment of the semiconductor device in FIG. 1A along the B-B line in FIG. 1A, during various manufacturing stages according to the method in FIGS. 2A-2B in accordance with embodiments of the present disclosure.

DETAILED DESCRIPTION

Figure 1A:
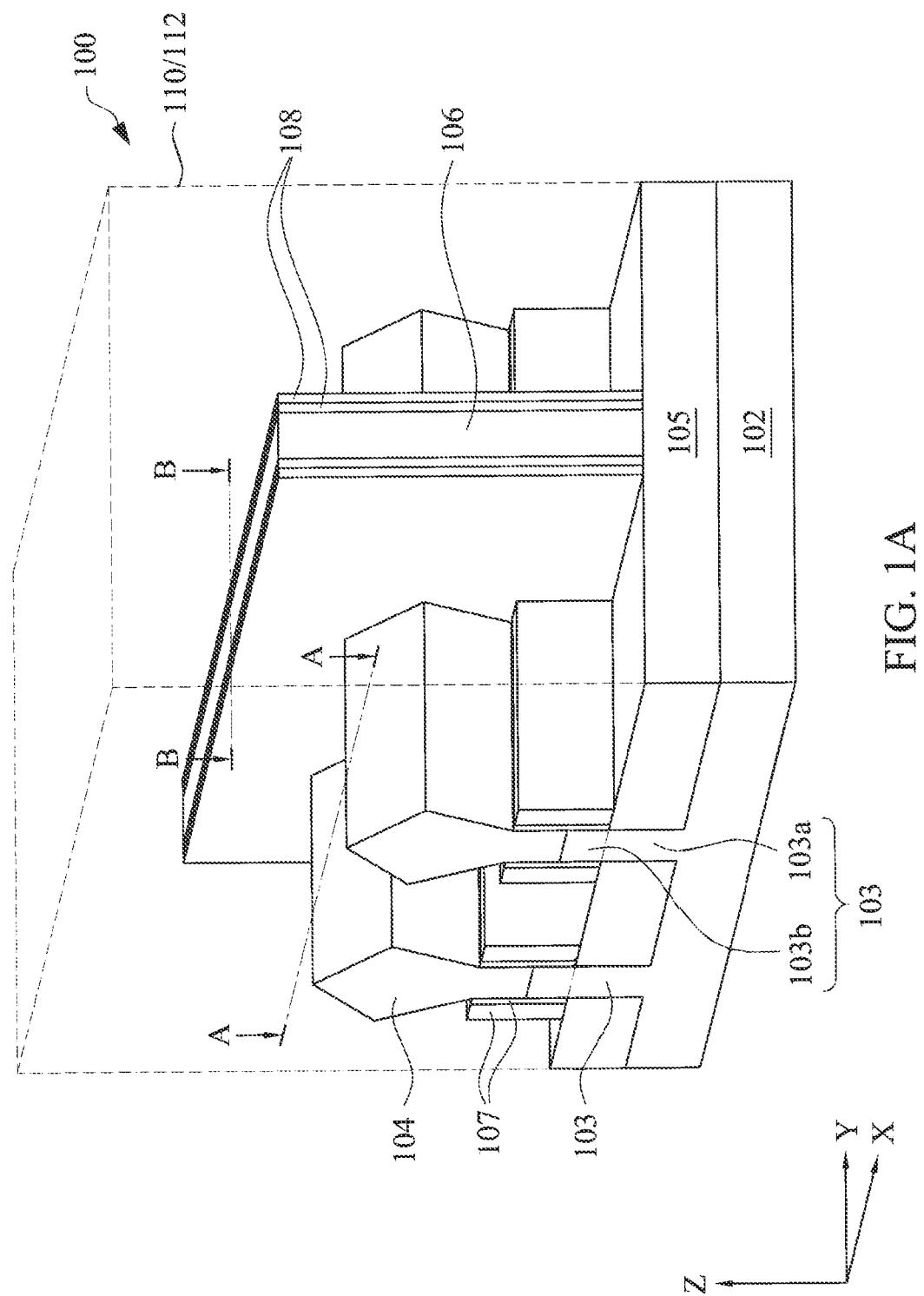
FIG. 1A shows a perspective view of a semiconductor device, in portion, in a manufacturing stage in accordance with embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term encompasses numbers that are within certain variations (such as +/−10% or other variations) of the number described, in accordance with the knowledge of the skilled in the art in view of the specific technology disclosed herein, unless otherwise specified. For example, the term "about 5 nm" may encompass the dimension range from 4.5 nm to 5.5 nm, 4.0 nm to 5.0 nm, etc.

The present disclosure is generally related to semiconductor devices and methods of forming the same. More particularly, the present disclosure is related to forming source/drain (S/D) features for p-type transistors such as p-type FinFETs or p-type GAA (gate-all-around) devices (such as GAA nanowire or GAA nanosheet devices). An object of the present disclosure is to reduce S/D contact resistance by providing S/D features with heavy p-type doping (or p-doping) at the upper (or outer) portion of the S/D features. For example, the S/D features may include silicon germanium with boron (B) doping. In an embodiment, the S/D features are provided with multiple layers (or sub-layers) that are epitaxially grown at different conditions where the p-doping is generally gradually increased as the thickness of the S/D features increases. For example, the sub-layer(s) with the highest p-doping may be provided at the corners of the S/D features (such as along the SiGe (110) plane) in addition to at the top of the S/D features. The sub-layer(s) with the highest p-doping is thick enough such that a sufficient portion of such sub-layer(s) remains after contact hole etching processes have completed. The remaining portion of such sub-layer(s) helps reduce the series resistance and S/D contact resistance. These and other aspects of the present disclosure will be further discussed with reference to FIGS. 1A-14.

FIG. 1A shows a perspective view of a semiconductor device 100, in portion, in a manufacturing stage in accordance with embodiments of the present disclosure. The semiconductor device 100 (or device 100) is provided for illustration purposes and does not necessarily limit the embodiments of the present disclosure to any number of devices, any number of regions, or any configuration of structures or regions. Furthermore, the device 100 may be an intermediate device or structure fabricated during processing of an IC, or a portion thereof, that may comprise static random access memory (SRAM) and/or logic circuits, passive components such as resistors, capacitors, and inductors, and active components such as p-type field effect transistors (PFETs), n-type FETs (NFETs), multi-gate FETs such as FinFETs, GAA devices, metal-oxide semiconductor field effect transistors (MOSFETs), complementary metal-oxide semiconductor (CMOS) transistors, bipolar transistors, high voltage transistors, high frequency transistors, other memory cells, and combinations thereof.

The device 100 includes a substrate 102 and various features formed therein or thereon. The device 100 further includes one or more semiconductor fins 103 separated by an isolation structure 105. The device 100 further includes gate stacks (or gate structures) 106 adjacent to channel regions of the fins 103 and S/D features 104 over the fins 103 and on both sides of the gate stacks 106. The device 100 further includes gate spacers 108 on sidewalls of the gate stacks 106, fin sidewall spacers 107 on sidewalls of the fins 103. The device 100 further includes one or more dielectric layers, such as a contact etch stop layer (CESL) 110 over the gate spacers 108 and the S/D features 104, and a dielectric layer (or interlayer dielectric layer or ILD) 112 over the CESL 110 and filling in the gaps between adjacent gate spacers 108. The CESL 110 and the ILD 112 are collectively shown as a dashed cube in FIG. 1A. The device 100 may include other features not shown in FIG. 1A. The various features (or components) of the device 100 are further described below.

The substrate 102 is a silicon (Si) substrate in the present embodiment. In alternative embodiments, the substrate 102 includes other elementary semiconductors such as germanium (Ge); a compound semiconductor such as silicon carbide (SiC), gallium arsenide (GaAs), indium arsenide (InAs), and indium phosphide (InP); or an alloy semiconductor, such as silicon germanium carbide (SiGeC), gallium arsenic phosphide (GaAsP), and gallium indium phosphide (GaInP). In embodiments, the substrate 102 may include silicon on insulator (SOI) substrate, be strained and/or stressed for performance enhancement, include epitaxial regions, doped regions, and/or include other suitable features and layers.

Figure 1B:
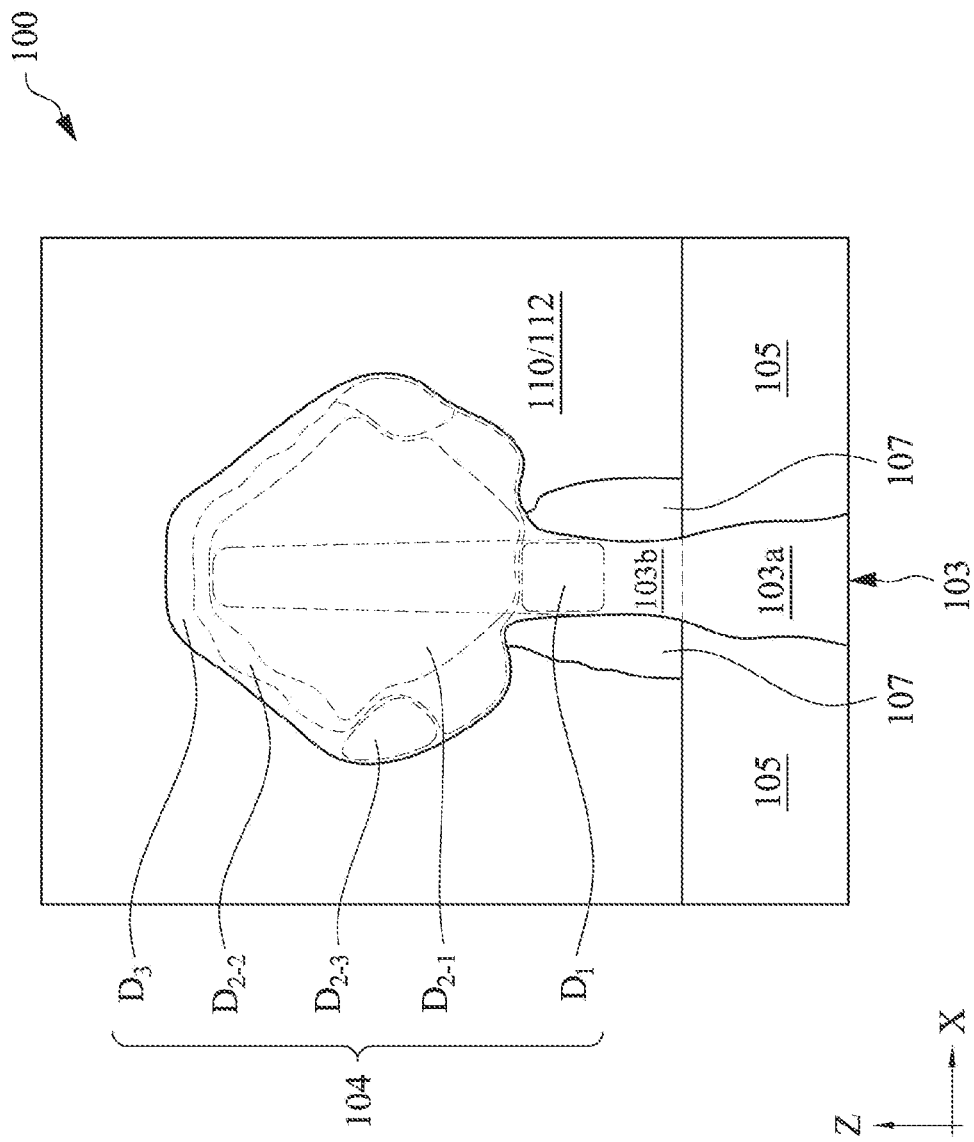
FIG. 1B shows a cross-sectional view of an embodiment of the semiconductor device of FIG. 1A in an S/D region and along the A-A line of FIG. 1A, in portion, in a manufacturing stage in accordance with embodiments of the present disclosure.

The fins 103 include one or more layers of semiconductor materials such as silicon or silicon germanium. In some embodiments, the fins 103 include multiple layers of semiconductor materials alternately stacked one over the other, for example, having multiple layers of silicon and multiple layers of silicon germanium alternately stacked. In the present embodiment as shown in FIGS. 1A and 1B, each fin 103 includes a base portion 103a over the substrate 102 and an upper portion 103b over the base portion 103a. In an embodiment, the base portion 103a is directly connected to the substrate 102 and the upper portion 103b is directly connected to the base portion 103a. In an embodiment, the base portion 103a includes the same material as the substrate 102, and the upper portion 103b includes a different material than the base portion 103a. For example, the base portion 103a includes silicon while the upper portion 103b includes silicon germanium. In an embodiment, the bottom surface of the upper portion 103b is about even with the upper surface of the isolation structure 105. The S/D feature 104 is disposed on the upper portion 103b. The fins 103 may be patterned by any suitable method. For example, the fins 103 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used as a masking element for patterning the fins 103. For example, the masking element may be used for etching recesses into semiconductor layers over or in the substrate 102, leaving the fins 103 on the substrate 102. The etching process may include dry etching, wet etching, reactive ion etching (RIE), and/or other suitable processes. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. For example, a wet etching process may comprise etching in diluted hydrofluoric acid (DHF); potassium hydroxide (KOH) solution; ammonia; a solution containing hydrofluoric acid (HF), nitric acid ($HNO_3$), and/or acetic acid ($CH_3COOH$); or other suitable wet etchant. Numerous other embodiments of methods to form the fins 103 may be suitable.

The S/D features 104 may include epitaxial semiconductor materials, for example, for applying proper stress and enhancing performance of the device 100. In the present embodiment, the S/D features 104 include epitaxially grown silicon germanium (SiGe) alloy, which is doped with one or more p-type dopants such as boron (B) or indium (In). Adjacent S/D features 104 may stand separate from each other in an embodiment or merged into a larger S/D feature in an alternative embodiment. In one implementation, the S/D features 104 are formed by etching recesses into the fins 103 and epitaxially growing SiGe alloy doped with one or more p-type dopants such as boron and/or indium. Further, each of the S/D features 104 may include multiple layers of SiGe alloy with different p-type dopant concentrations and/or different Ge atomic percent (Ge %). Each of the S/D features 104 may be of any suitable shape such as a multi-facet shape. More details of the S/D features 104 will be further described with reference to FIGS. 1B, 1C, 1D-1, and 1D-2 in a later section of the present disclosure.

The isolation structure 105 may include silicon oxide ($SiO_2$), silicon nitride ($Si_3N_4$), silicon oxynitride (SiON), fluoride-doped silicate glass (FSG), a low-k dielectric material, and/or other suitable insulating material. In an embodiment, the isolation structure 105 is formed by etching trenches in or over the substrate 102 (e.g., as part of the process of forming the fins 103), filling the trenches with an insulating material, and performing a chemical mechanical planarization (CMP) process and/or an etching back process to the insulating material, leaving the remaining insulating material as the isolation structure 105. Other types of isolation structure may also be suitable, such as field oxide and LOCal Oxidation of Silicon (LOCOS). The isolation structure 105 may include a multi-layer structure, for example, having one or more liner layers on surfaces of the substrate 102 and the fins 103 and a main isolating layer over the one or more liner layers.

Each of the gate stacks 106 includes a multi-layer structure. For example, referring to FIG. 1C, each of the gate stacks 106 may include a dielectric interfacial layer (not shown), a gate dielectric layer 106A (such as having $SiO_2$) over the dielectric interfacial layer, and a gate electrode layer 106B over the gate dielectric layer 106A. In an embodiment, each of the gate stacks 106 includes a so-called "high-k metal gate" that may include a high-k gate dielectric layer 106A, a work function layer (a part of the gate electrode layer 106B) over the high-k gate dielectric layer, and a metal layer (another part of the gate electrode layer 106B) over the work function layer. The gate stacks 106 may include additional layers such as capping layers and barrier layers. In various embodiments, the dielectric interfacial layer may include a dielectric material such as silicon oxide ($SiO_2$) or silicon oxynitride (SiON), and may be formed by chemical oxidation, thermal oxidation, atomic layer deposition (ALD), chemical vapor deposition (CVD), and/or other suitable methods. The high-k gate dielectric layer may include hafnium oxide ($HfO_2$), zirconium oxide ($ZrO_2$), lanthanum oxide ($La_2O_3$), titanium oxide ($TiO_2$), yttrium oxide ($Y_2O_3$), strontium titanate ($SrTiO_3$), other suitable metal-oxides, or combinations thereof; and may be formed by ALD and/or other suitable methods. The work function layer may include a metal selected from but not restricted to the group of titanium aluminum nitride (TiAlN), titanium nitride (TiN), tantalum nitride (TaN), ruthenium (Ru), molybdenum (Mo), tungsten (W), platinum (Pt), aluminum (Al), or combinations thereof; and may be deposited by CVD, PVD, and/or other suitable process. The gate electrode layer may include polysilicon or a metal such as aluminum (Al), tungsten (W), cobalt (Co), copper (Cu), and/or other suitable materials; and may be deposited using plating, CVD, PVD, or other suitable processes. The gate stacks 106 may be formed by any suitable processes including gate-first processes and gate-last processes. In a gate-first process, various material layers are deposited and patterned to become the gate stacks 106 before the S/D features 104 are formed. In a gate-last process (also termed as a gate replacement process), sacrificial (or temporary) gate structures are formed first. Then, after the S/D features 104 are formed, the sacrificial gate structures are removed and replaced with the gate stacks 106.

Each of the fin sidewall spacers 107 and the gate spacers 108 may be a single layer or multi-layer structure. In some embodiments, each of the spacers 107 and 108 include a dielectric material, such as silicon oxide ($SiO_2$), silicon nitride ($Si_3N_4$), silicon oxynitride (SiON), other dielectric material, or a combination thereof. In an example, the spacers 107 and 108 are formed by depositing a first dielectric layer (e.g., a $SiO_2$ layer having a substantially uniform thickness) as an liner layer over the device 100 including the gate stacks 106 and the fins 103, and a second dielectric layer (e.g., a $Si_3N_4$ layer) as a main D-shaped spacer over the first dielectric layer, and then, anisotropically etching to remove portions of the dielectric layers to form the spacers 107 and 108. Additionally, the fin sidewall spacers 107 may be partially removed during the etching process that forms recesses into the fins 103 prior to growing the S/D features 104. In some embodiments, the fin sidewall spacers 107 may be completely removed by such etching process.

The CESL 110 may include silicon nitride ($Si_3N_4$), silicon oxynitride (SiON), silicon nitride with oxygen (O) or carbon (C) elements, and/or other materials. The CESL 110 may be formed by plasma enhanced CVD (PECVD) process and/or other suitable deposition or oxidation processes. The CESL 110 covers the outer surfaces of the S/D features 104, the sidewalls of the gate spacers 108, and the top surface of the isolation structure 105. The ILD 112 may include materials such as tetraethylorthosilicate (TEOS) formed oxide, un-doped silicate glass, or doped silicon oxide such as borophosphosilicate glass (BPSG), fluoride-doped silicate glass (FSG), phosphosilicate glass (PSG), boron doped silicon glass (BSG), and/or other suitable dielectric materials. The dielectric layer 112 may be deposited by a PECVD process, a flowable CVD (FCVD) process, or other suitable deposition technique. In an embodiment, the CESL 110 is deposited as a conformal layer over the substrate 102 covering various structures thereon, and the dielectric layer 112 is deposited over the CESL 110 to fill trenches between the gate stacks 106.

FIG. 1B shows a cross-sectional view of the semiconductor device 100 in an S/D region along the A-A line of FIG. 1A, in portion, according to an embodiment. Referring to FIG. 1B, the S/D feature 104 includes multiple layers (or sub-layers) including layers D1, D2-1, D2-2, D2-3, and D3 in the present embodiment. The layer D1 is disposed over the semiconductor fin 103. In an embodiment, the layer D1 is disposed directly on the semiconductor fin 103. The layer D1 has a lateral width (along the "X" direction) that is about the same as that of the semiconductor fin 103. The layer D2-1 is disposed over the layer D1 and extends laterally (along the "X" direction) wider than the semiconductor fin 103 and the layer D1. In an embodiment, the layer D2-1 is disposed directly on the layer D1. The layer D2-2 is disposed over the layer D2-1. In an embodiment, the layer D2-2 is epitaxially grown from the outer surface of the layer D2-1. In the embodiment depicted in FIG. 1B, the layer D2-3 is disposed at a corner portion of the S/D feature 104 where the S/D feature 104 has the largest lateral dimension along the "X" direction. In an embodiment, the layer D2-3 is disposed at a corner portion formed by SiGe (111) planes and extends along SiGe [110] direction. The layer D3 is disposed over both the layers D2-2 and D2-3. In the present embodiment, each of the layers D1, D2-1, D2-2, D2-3, and D3 includes silicon germanium doped with a p-type dopant. In an embodiment, the p-type dopant includes boron (B). Further, the layer D2-3 has a higher doping concentration of the p-type dopant (such as B) than each of the layers D1, D2-1 and D2-2. The layers D2-3 and D3 may have about the same doping concentration of the p-type dopant in an embodiment.

Figure 1C:
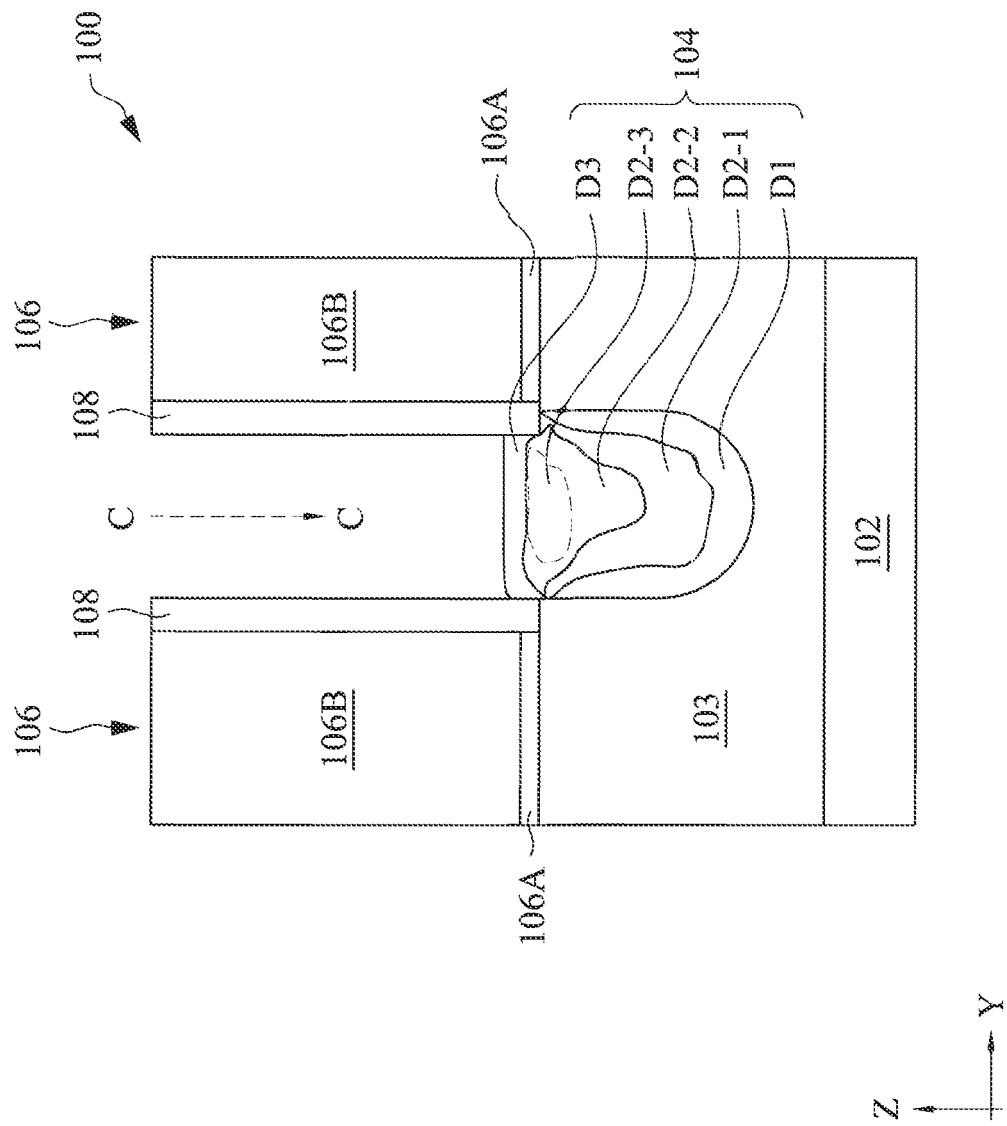
FIG. 1C shows a cross-sectional view of the semiconductor device of FIG. 1A and along the B-B line of FIG. 1A, in portion, in a manufacturing stage in accordance with embodiments of the present disclosure.

FIG. 1C shows a cross-sectional view of the semiconductor device 100 along the B-B line of FIG. 1A, in portion, according to an embodiment. Referring to FIG. 1C, in this cross-section, the layers D1, D2-1, and D2-3 are within the S/D trench etched into the semiconductor fin 103 and stay at or below the top surface of the semiconductor fin 103. Further, the layer D2-2 is partially within the S/D trench. In other words, part of the layer D2-2 extends below the top surface of the semiconductor fin 103 and part of the layer D2-2 extends above the top surface of the semiconductor fin 103. Still further, the layer D3 is above the top surface of the semiconductor fin 103.

Figures 1, 1D:
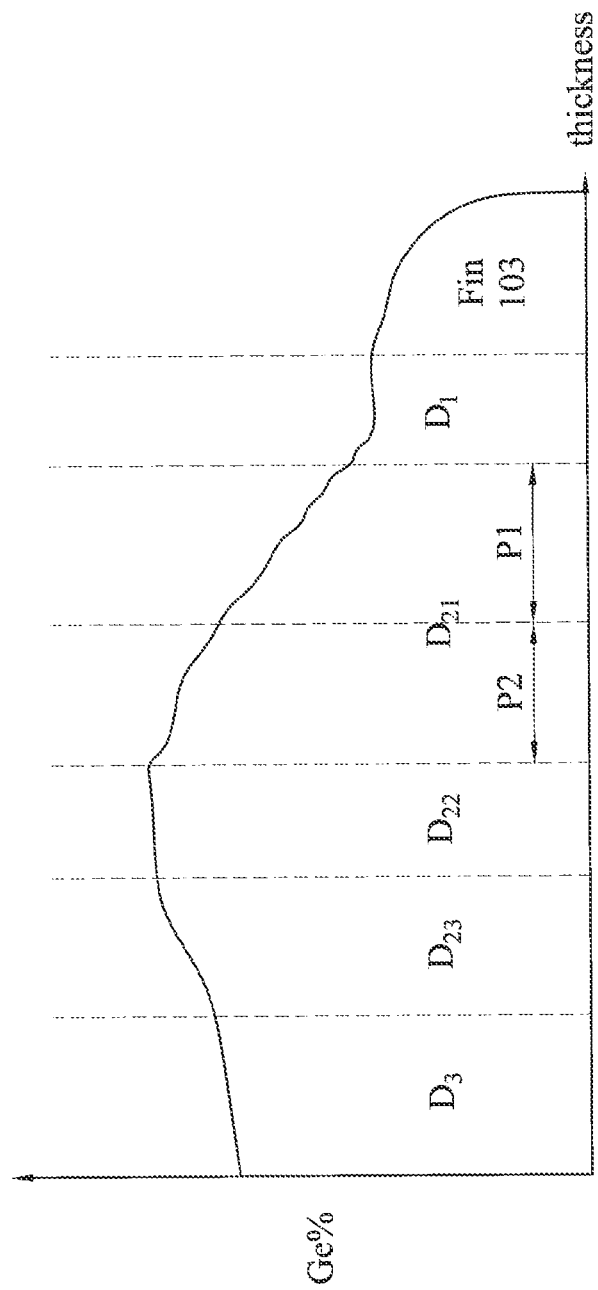
FIGS. 1D-1 and 1D-2 illustrate atomic percent of germanium and doping concentration of a p-type dopant (such as boron), respectively, in various layers of an S/D feature in an embodiment of the semiconductor device of FIG. 1A.
Figures 1, 1D, 2:
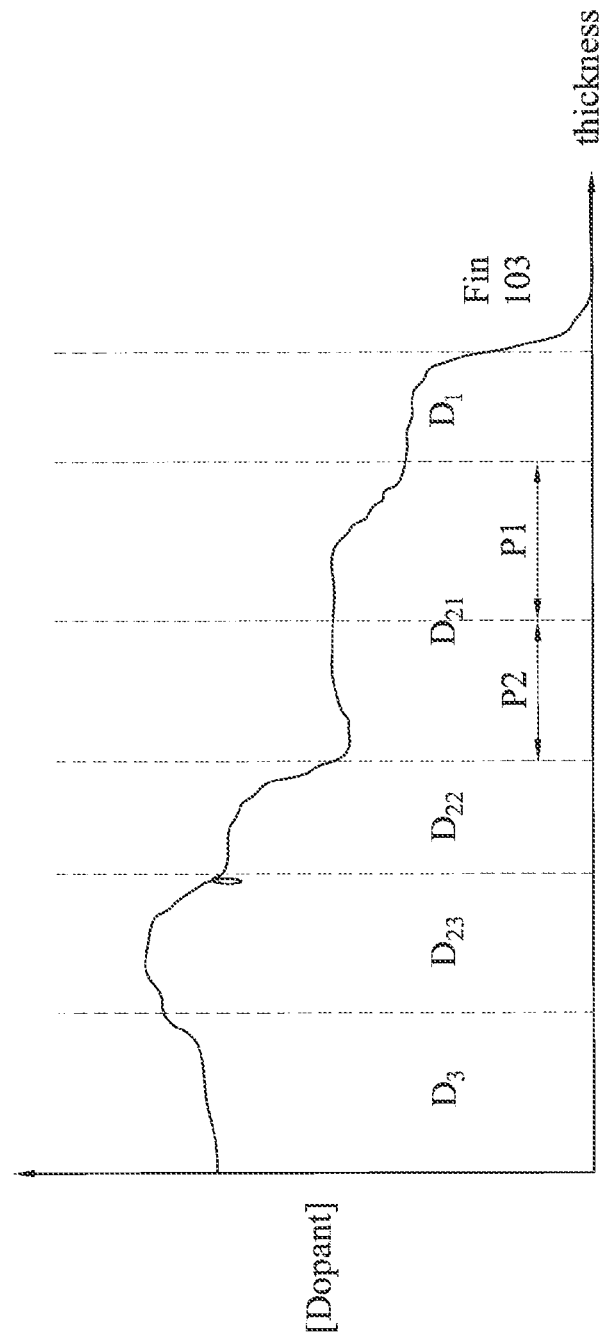

FIGS. 1D-1 and 1D-2 show two graphs that illustrate the atomic percent of germanium (Ge %) and the doping concentration of a p-type dopant (such as boron), respectively, in the various layers of the S/D feature 104 according to an embodiment. The graphs are plotted along the direction pointed to by the C-C arrow in FIG. 1C. The following discussion is made with reference to FIGS. 1B, 1C, 1D-1, and 1D-2 collectively.

In the present embodiment, the upper portion 103b of the semiconductor fin 103 includes silicon germanium (SiGe) that is undoped. However, portions of the semiconductor fin 103 adjacent to the S/D features 104 (for example, the portions of the semiconductor fin 103 directly under the spacers 108 in FIG. 1C) may be unintentionally doped by dopants diffusing from the S/D features 104. The Ge atomic percent (Ge %) in the upper portion 103b of the semiconductor fin 103 is about 15 at. % to about 30 at. % in an embodiment.

In an embodiment, the layer D1 includes a silicon (Si) seed layer directly on the upper portion 103b of the semiconductor fin 103, a SiGe seed layer on the Si seed layer, and a p-type doped (such as B doped) SiGe layer on the SiGe seed layer. In an embodiment, the layer D1 has a thickness in a range about 3 nm to about 10 nm along the "X" direction and a height in a range about 10 nm to about 30 nm along the "Z" direction. The height of the layer D1 is controlled such that it does not extend above the top surface of the semiconductor fin 103. The Ge % in the SiGe seed layer and the doped SiGe layer of the layer D1 is about 15 at. % to about 30 at. %. The Ge % in the SiGe seed layer and the doped SiGe layer of the layer D1 is about the same as that in the upper portion 103b of the semiconductor fin 103. In an embodiment, the concentration of B in the B doped SiGe layer of the layer D1 is about 5E19 atoms/cm$^3$ to about 5E20 atoms/cm$^3$. The three-layered structure in the layer D1 helps to reduce defects in the SiGe alloy that grows on the layer D1 and helps to reduce short channel effects in the transistor.

In an embodiment, the layer D2-1 includes two sub-layers P1 and P2 that are grown at different process conditions. The Ge % in the layer D2-1 generally gradually increases as the thickness of the layer D2-1 increases. In an embodiment, the Ge % in the layer D2-1 gradually increases from about 25 at. % to about 65 at. %. The gradient Ge % in the layer D2-1 helps to reduce the defects in the SiGe alloy due to the difference in the Si and Ge lattice structures. In the present embodiment, the layer D2-1 is the thickest layer in the S/D feature 104. In other words, the layer D2-1 is thicker than any of the layers D1, D2-2, D2-3, and D3. Thus, reducing defects in the layer D2-1 improves the overall crystalline quality of the S/D feature 104. Further, the doping concentration in the layer D2-1 increases from that in the layer D1. Particularly, the doping concentration in the sub-layer P1 gradually increases and the doping concentration in the sub-layer P2 gradually decreases. In an embodiment, the B doping concentration in the sub-layer P1 gradually increases from about 5E20 atoms/cm$^3$ to about 1E21 atoms/cm$^3$. In an embodiment, the B doping concentration in the sub-layer P2 gradually decreases from about 1E21 atoms/cm$^3$ to about 8E20 atoms/cm$^3$. In various embodiments, the outermost part of the sub-layer P2 still has a higher doping concentration than the innermost part of the sub-layer P1. By providing the two sub-layers P1 and P2 grown at different process conditions, the Ge % and the doping concentration each reach a desirable level, making the outermost portion of the sub-layer P2 suitable for the growth of the D2-2 layer. For example, the Ge % may peak at the outermost portion of the layer D2-1 among the layers D1, D2-1, D2-2, D2-3 and D3 while the doping concentration at the outermost portion of the layer D2-1 is kept at a relatively lower level. The layer D2-1 may have a thickness (at its widest part) along the "X" direction in a range about 20 nm to about 60 nm (see FIG. 1B). In some embodiment, the thickness of the layer D2-1 is about 4 to 6 times of the thickness of the layer D1. In other words, the layer D2-1 extends substantially beyond the layer D1 along the "X" direction. In some embodiment, the thickness of the sub-layer P1 is less than or equal to the thickness of the sub-layer P2.

In an embodiment, the layer D2-2 has a substantially constant Ge % throughout its thickness. For example, the Ge % in the layer D2-2 may be in a range about 45 at. % to about 65 at. %. The layer D2-2 is sometimes referred to as a marker layer as its Ge % is substantially constant while the underlying layer (i.e., the layer D2-1) and the overlying layer (i.e., the layer D2-3) each has a gradient Ge %. Therefore, the layer D2-2 marks a change in the epitaxial growth processes. The Ge % in the layer D2-2 may be slightly lower than the peak Ge % in the layer D2-1, for example, by about 1 at. % to about 5 at. % in an embodiment. Further, the layer D2-2 has a gradient doping concentration throughout its thickness, with the doping concentration gradually increases as the thickness of the layer D2-2 increases. The doping concentration gradient (i.e., the rate at which the doping concentration increases) in the layer D2-2 is higher than that in other layers. In an embodiment, the B doping concentration gradually increases from about 1E21 atoms/cm$^3$ to about 2E21 atoms/cm$^3$ as the thickness of the layer D2-2 increases. The doping concentration in the layer D2-2 is higher than that in the layer D2-1 (both the sub-layers P1 and P2). The thickness of the layer D2-2 is smaller than that of the layer D2-1. For example, the thickness of the layer D2-2 may be about 0.2 to about 0.4 of the thickness of the layer D2-1. In an embodiment, the thickness of the layer D2-2 is in a range about 5 nm to about 15 nm.

In an embodiment, the layer D2-3 has a gradient Ge % throughout its thickness, where the Ge % gradually decreases as the thickness of the layer D2-3 increases from its starting position off the layer D2-2. For example, the Ge % in the layer D2-3 may gradually decreases from about 65 at. % to about 40 at. % in an embodiment. As will be discussed with reference to FIG. 1E, the device 100 further includes a silicide feature 128 and a contact 130 that are disposed on the layer D2-3. Having a relatively lower Ge % in the layer D2-3 helps to reduce potential Ge extrusion and agglomeration, thereby reducing sheet resistance and contact resistance. The doping concentration in the layer D2-3 initially increases from that in the layer D2-2 and then remains substantially constant. For example, the B doping concentration in an inner part of the layer D2-3 may gradually increases from about 1E21 atoms/cm$^3$ to about 3E21 atoms/cm$^3$ and the B doping concentration in an outer part of the layer D2-3 may be substantially constant and is in a range from about 2.6E21 atoms/cm$^3$ to about 3E21 atoms/cm$^3$. The doping concentration in the layer D2-3 is higher than any of the layers D1, D2-1, and D2-2. Thus, the doping concentration in the S/D feature 104 gradually increases from its initial layer D1 (which has a relatively low doping concentration) to the layer D2-3. The high doping concentration in the layer D2-3 provides reduced series resistance and reduced contact resistance. The thickness of the layer D2-3 is greater than that of the layer D2-2. For example, the thickness of the layer D2-3 may be about 2 to about 6 times of the thickness of the layer D2-2. In an embodiment, the thickness of the layer D2-3 is in a range about 10 nm to about 30 nm.

In an embodiment, the layer D3 has a substantially constant Ge % throughout its thickness, with a Ge % lower than or equal to that of the layer D2-3. For example, the Ge % in the layer D3 may be in a range about 40 at. % to about 60 at. % in an embodiment. In another embodiment, the layer D3 has a gradient Ge % throughout its thickness, with the Ge % gradually decreases as the thickness of the layer D3 increases from its starting position off the layer D2-2 and D2-3. As will be discussed with reference to FIG. 1E, the device 100 further includes a silicide feature 128 and a contact 130 that are disposed on the layer D3. Having a relatively lower Ge % in the layer D3 helps to reduce potential Ge extrusion and agglomeration, thereby reducing sheet resistance and contact resistance. In an embodiment, the doping concentration in the layer D3 may slightly decrease from that in the layer D2-3 and then remains substantially constant. In another embodiment, the doping concentration in the layer D3 is about the same as that in the layer D2-3. The doping concentration in the layer D3 is higher than any of the layers D1, D2-1, and D2-2. In an embodiment, the B doping concentration in the layer D3 is substantially constant and is in a range from about 1E21 atoms/cm$^3$ to about 2E21 atoms/cm$^3$. The high doping concentration in the layer D3 provides reduced series resistance and reduced contact resistance. In an embodiment, the thickness of the layer D3 is greater than or equal to that of the layer D2-2. For example, the thickness of the layer D3 may be about 1 to about 2 times of the thickness of the layer D2-2. In an embodiment, the thickness of the layer D3 is in a range about 5 nm to about 30 nm. The p-type doping (such as B doping) in the layers D2-3 and D3 is high (higher than other layer D2-2, D2-1, and D1) to maintain a desired shape of the S/D feature 104. It also helps to maintain the shape of the S/D feature 104 during contact hole etching as higher p-type doping generally provides higher etch resistance during contact hole etching processes. Further, when Ge % is near the saturation of interstitial sites, the Ge % is inversely proportional to the doping (such as B doping) in the epitaxial layer. Compared to the layer D2-2, the Ge % in the layers D2-3 and D3 are slightly reduced to allow higher doping.

Figure 1E:
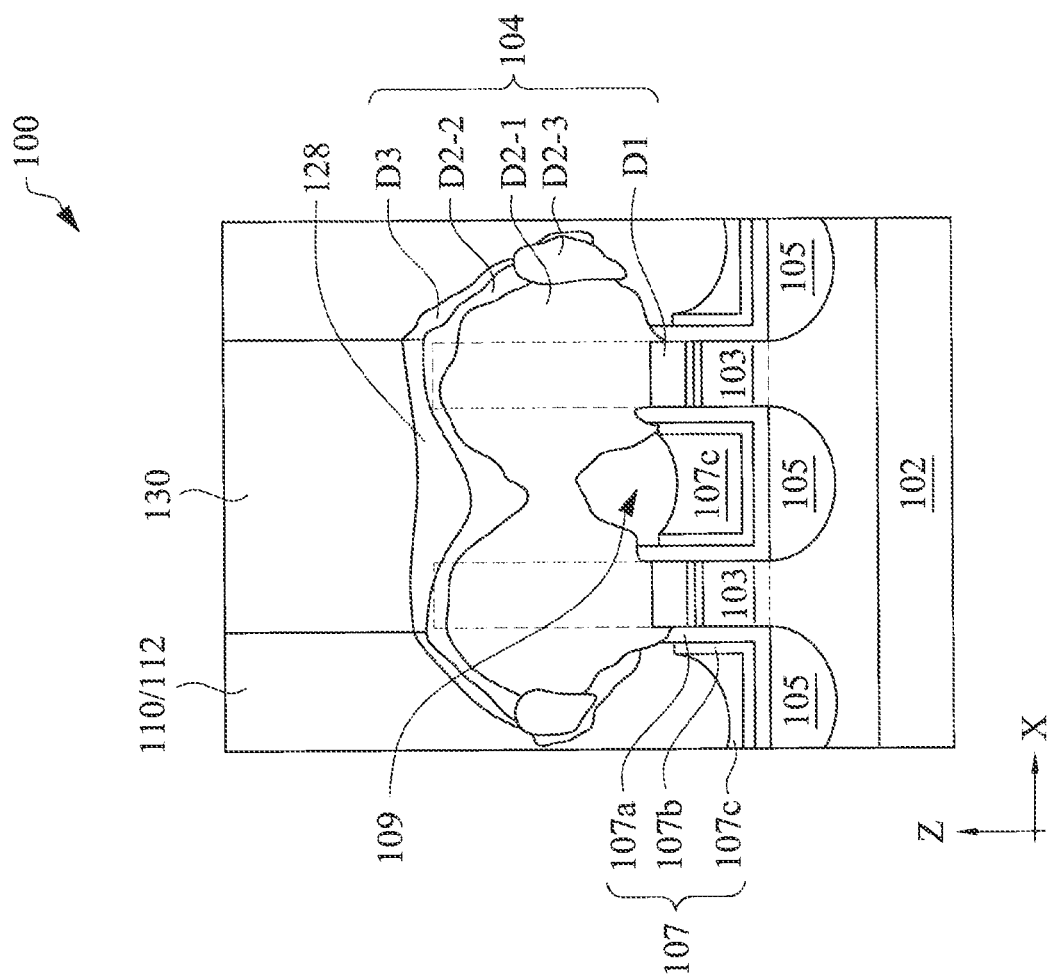
FIG. 1E shows a cross-sectional view of another embodiment of the semiconductor device of FIG. 1A in an S/D region and along the A-A line of FIG. 1A, in portion, in a manufacturing stage in accordance with embodiments of the present disclosure.

In an embodiment, the S/D feature 104 may be stand-alone. In other words, adjacent S/D features 104 do not merge with or touch each other. In another embodiment, adjacent S/D features 104 merge with each other to form a larger S/D feature. FIG. 1E illustrates one such embodiment. Referring to FIG. 1E, the S/D features 104 on two adjacent fins 103 merge with each other, leaving an air gap 109 between the merged portion of the S/D features 104 and the underlying fin sidewall spacers 107. The device 100 includes a silicide feature 128 disposed on the S/D feature 104 and a contact 130 disposed on the silicide feature 128. More particularly, the silicide feature 128 is disposed on the layers D2-3 and D3 which have relatively higher doping concentration and relatively lower Ge % (compared with the layer D2-2 as discussed above). Further, the interface between the silicide feature 128 and the S/D feature 104 may be wavy to increase the interfacial area therebetween. In the present embodiment, the silicide feature 128 includes one or more compounds having SiGe and one or more metals. For example, the silicide feature 128 may include titanium germanosilicide (TiSiGe), nickel germanosilicide (NiSiGe), nickel-platinum germanosilicide (NiPtSiGe), ytterbium germanosilicide (YbSiGe), platinum germanosilicide (PtSiGe), iridium germanosilicide (IrSiGe), erbium germanosilicide (ErSiGe), cobalt germanosilicide (CoSiGe), or other suitable compounds. In embodiments, the S/D contact 130 may include tungsten (W), cobalt (Co), copper (Cu), other metals, metal nitrides such as titanium nitride (TiN), titanium aluminum nitride (TiAlN), tungsten nitride (WN), tantalum nitride (TaN), or combinations thereof, and may be formed by CVD, PVD, plating, and/or other suitable processes. FIG. 1E further illustrates that the fin sidewall spacer 107 includes multiple layers 107a, 107b, and 107c in this embodiment. For example, the layer 107a may include silicon nitride, the layer 107b may include silicon oxy carbonitride or silicon carbonitride, and the layer 107c may include silicon dioxide.

Figure 2A:
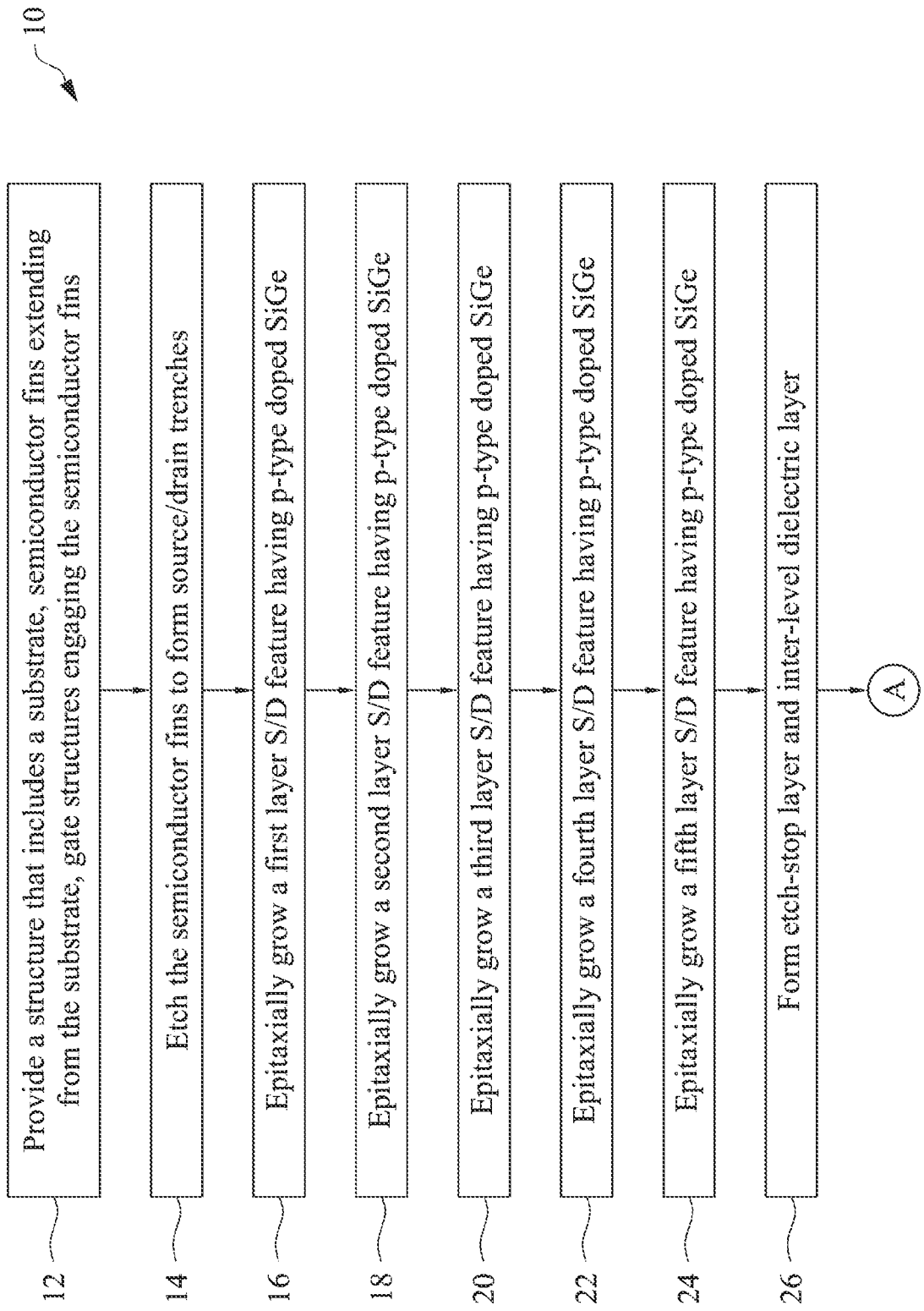
FIGS. 2A and 2B show a flow chart of a method of forming a semiconductor device according to embodiments of the present disclosure.
Figure 2B:
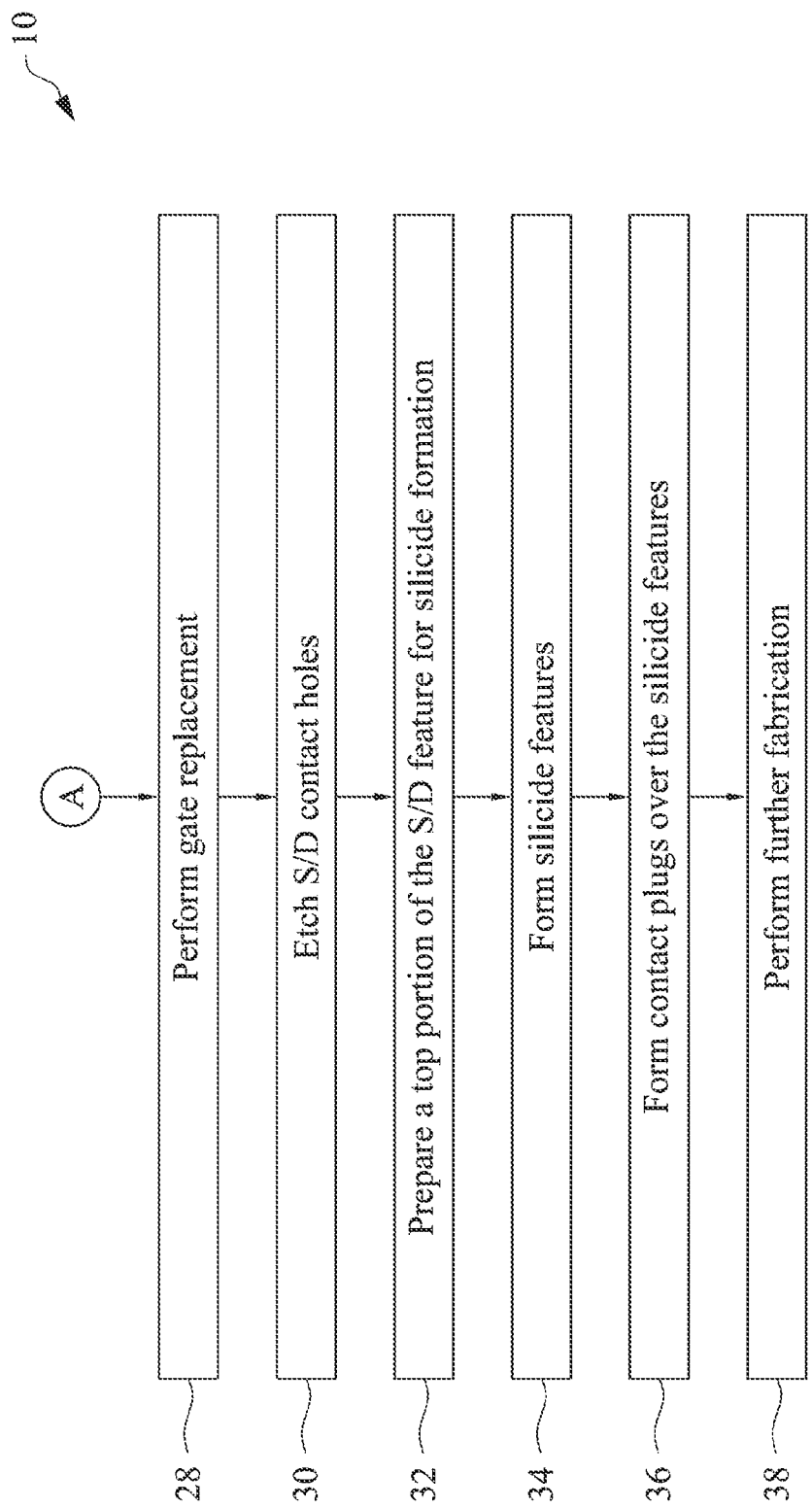

FIGS. 2A-2B show a flow chart of a method 10 of forming an embodiment of the semiconductor device 100, according to various aspects of the present disclosure. The method 10 is merely an example, and is not intended to limit the present disclosure beyond what is explicitly recited in the claims. Additional operations can be provided before, during, and after the method 10, and some operations described can be replaced, eliminated, or relocated for additional embodiments of the method. Method 10 is described below in conjunction with FIGS. 3A-13 which are cross-sectional views of the semiconductor device 100 in various stages of a manufacturing process. Particularly, FIGS. 3A, 4A, 5A, 6A, 7A, 8A, 9A, 10, 11, 12, and 13 are cross-sectional views of a portion of the device 100 along a fin width direction "A-A" of FIG. 1A; and FIGS. 3B, 4B, 5B, 6B, 7B, 8B, and 9B are cross-sectional views of the portion of the device 100 along a fin length direction "B-B" of FIG. 1A.

Figure 3B:
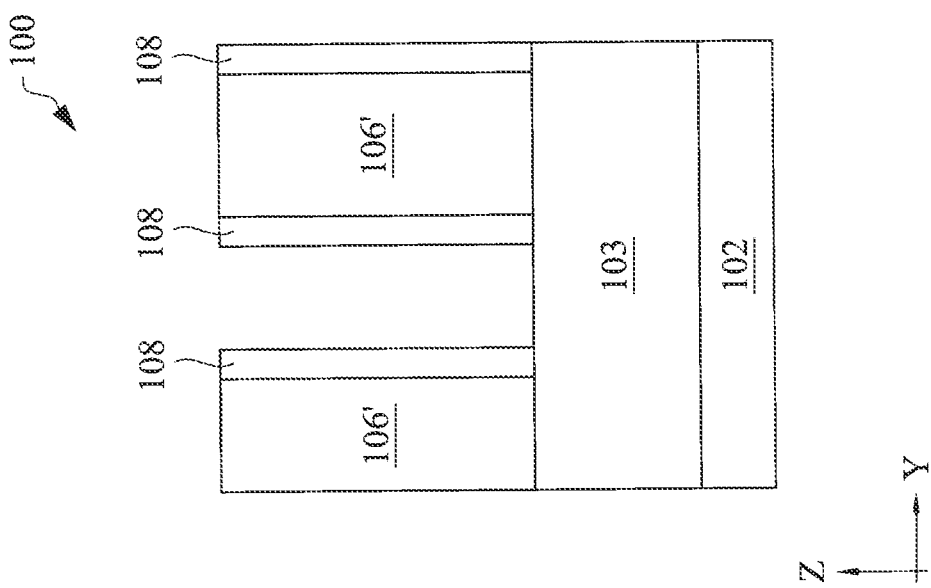
Figure 3A:
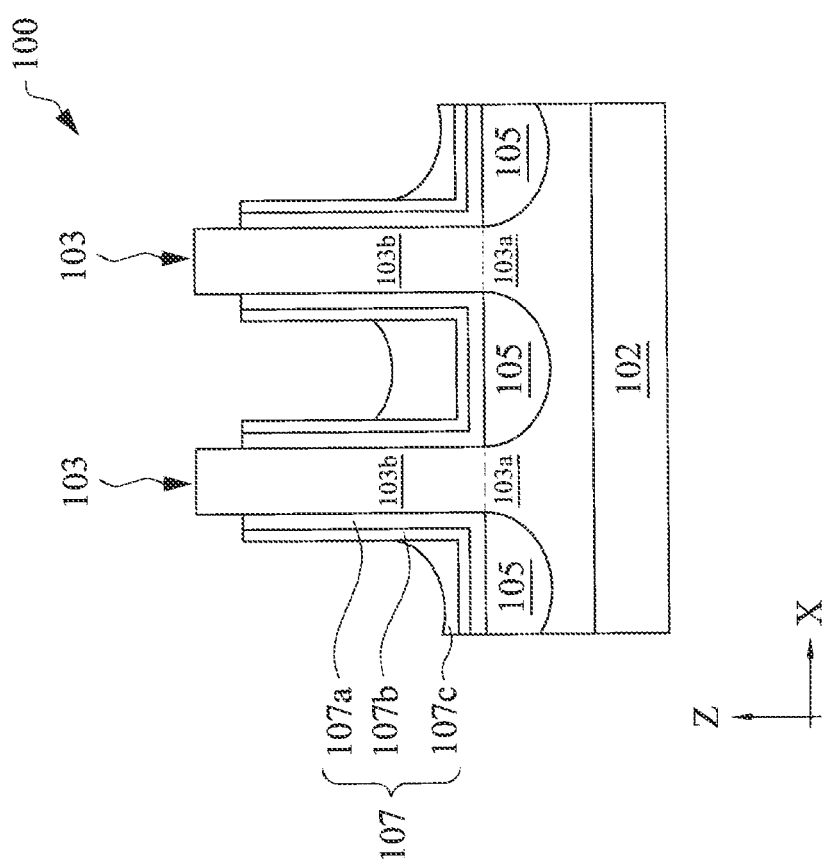

At operation 12, the method 10 (FIG. 2A) provides a structure of the device 100 as shown in FIGS. 3A and 3B. Referring to FIGS. 3A and 3B, the device 100 includes a substrate 102 and various features formed therein or thereon. The device 100 further includes one or more semiconductor fins 103 separated by an isolation structure 105. Each fin 103 includes a base portion 103a and an upper portion 103b. The device 100 further includes gate stacks (or gate structures) 106' adjacent to channel regions of the fin 103. The device 100 further includes gate spacers 108 on sidewalls of the gate stacks 106', fin sidewall spacers 107 on sidewalls of the fins 103. The gate stacks 106' are sacrificial structures that will be replaced with high-k metal gate stacks in subsequent processes in the present embodiment. The sacrificial gate stacks 106' may include a sacrificial gate dielectric layer (such as silicon oxide) and a sacrificial gate electrode layer (such as polysilicon). The various components 102, 103, 105, and 108 have been discussed with reference to FIG. 1A. In an embodiment, the substrate 102 includes Si (100) and the semiconductor fins 103 include silicon germanium ($Si_{1-x}Ge_x$) where the Ge % is in a range from about 15 at. % to about 30 at. %.

Figure 4B:
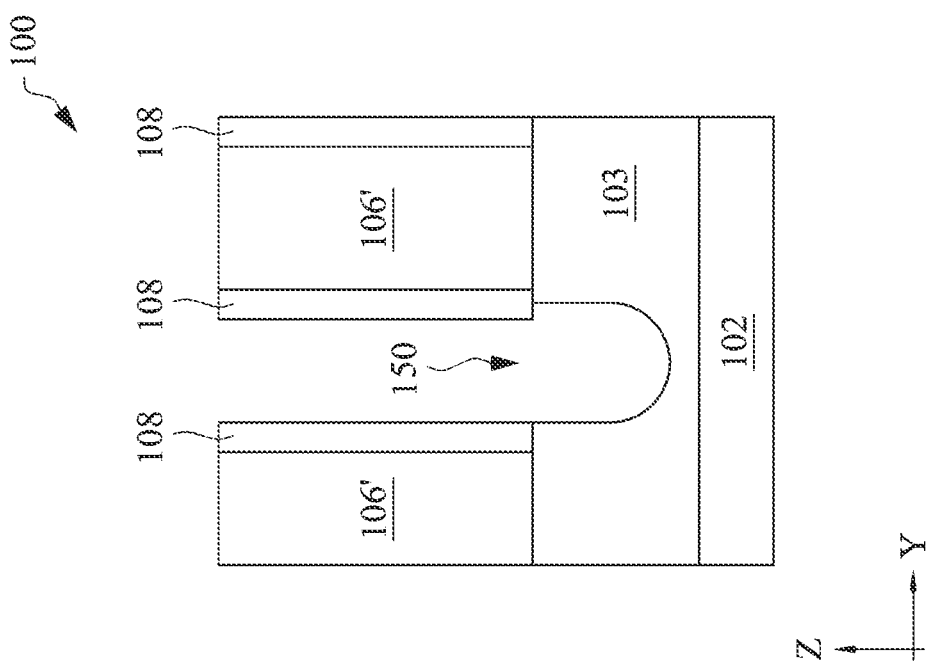
Figure 4A:
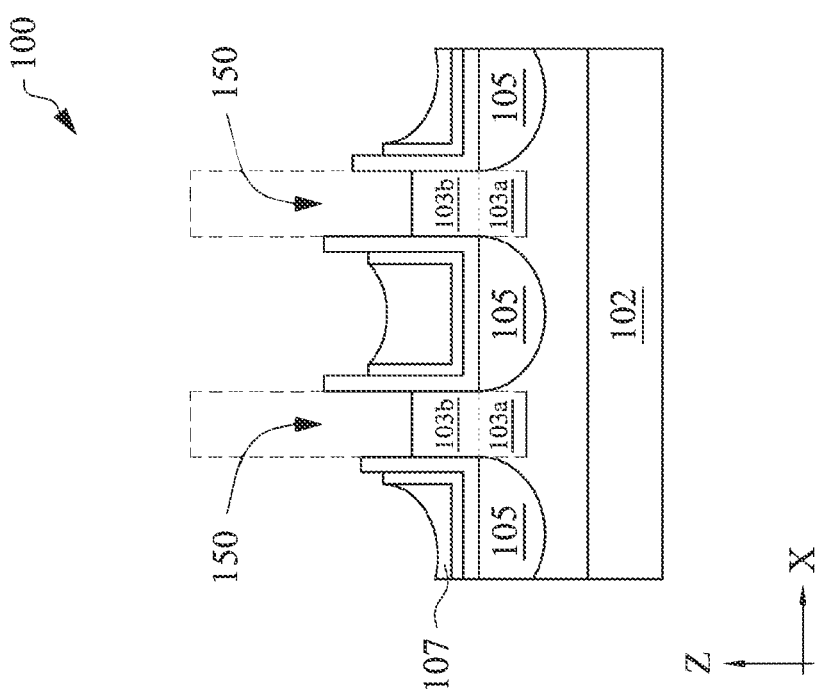
Figure 14:
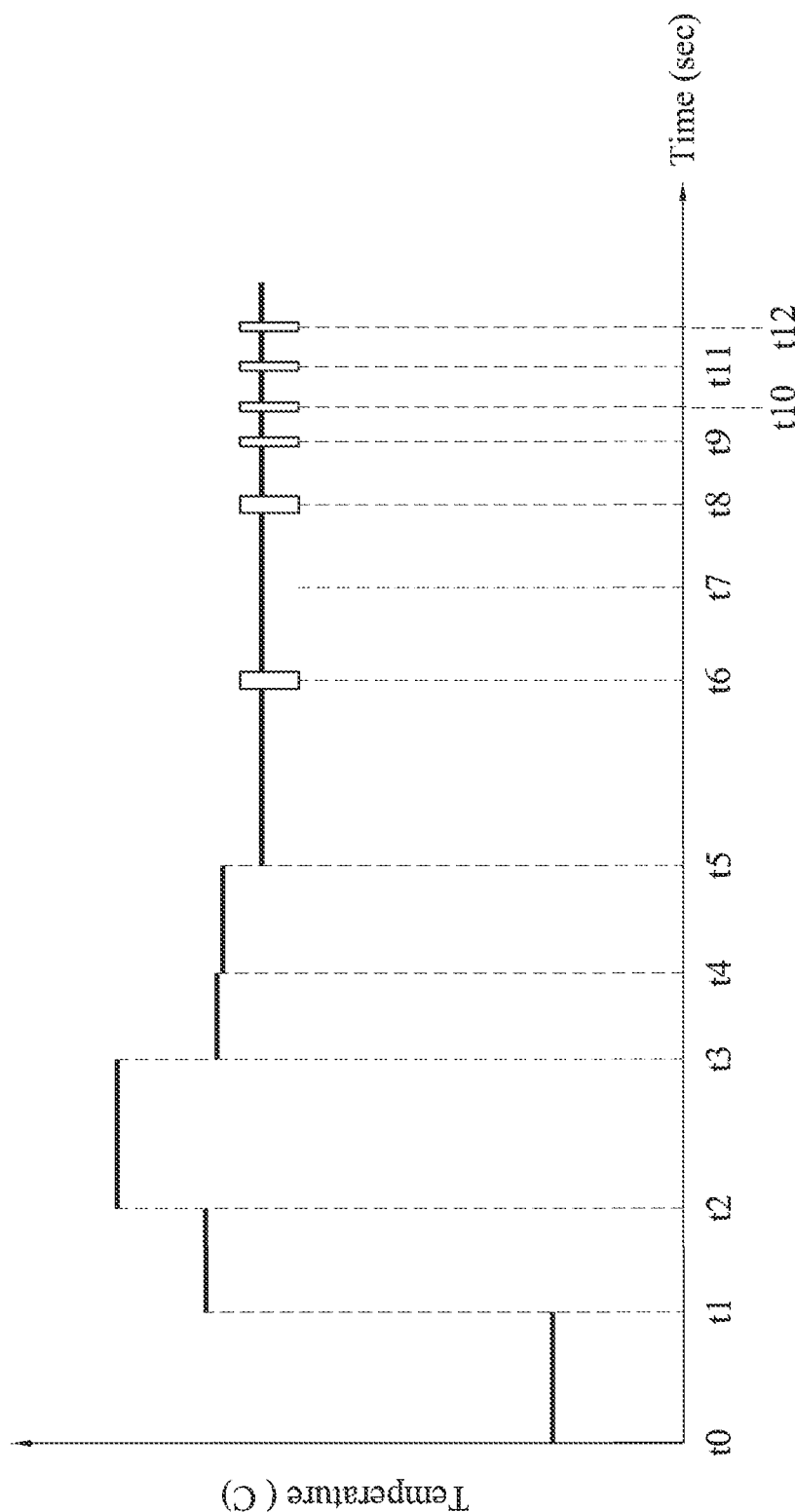
FIG. 14 illustrates thermal processes during various stages of the method in FIGS. 2A and 2B according to embodiments of the present disclosure.

At operation 14, the method 10 (FIG. 2A) etches the semiconductor fins 103, particularly the upper portion 103b, to form S/D trenches 150, such as shown in FIGS. 4A and 4B. In the present embodiment, the bottom surface of the S/D trenches 150 is above the top surface of the isolation structure 105, thus the bottom and the sidewall surfaces of the S/D trench 150 are within the upper portion 103b of the semiconductor fin 103. In an alternative embodiment, the bottom surface of the S/D trenches 150 may extend below the top surface of the isolation structure 105. Further, the profile of the S/D trenches 150 in the "Y-Z" plane (FIG. 4B) is substantially rectangular with rounded bottom corners in this embodiment, but may be of other shapes in alternative embodiments, such as polygonal (such as hexagonal). Still further, the S/D trenches 150 may extend directly below the spacers 108 along the "Y" direction. Along the "X" direction, the shape of the S/D trenches 150 are limited by the sidewall spacers 107. FIG. 4A also illustrates the remaining portion of the semiconductor fins 103 using the dashed boxes. The operation 14 may apply dry etching, wet etching, or a combination thereof. After the etching process finishes, the operation 14 may perform a cleaning process to the S/D trenches 150 in preparation for the subsequent epitaxial growth process. In an embodiment, the cleaning process is performed at a temperature in a range from room temperature (e.g., 20° C.) to about 200° C., such as shown in FIG. 14 for the duration from t0 to t1.

Figure 5B:
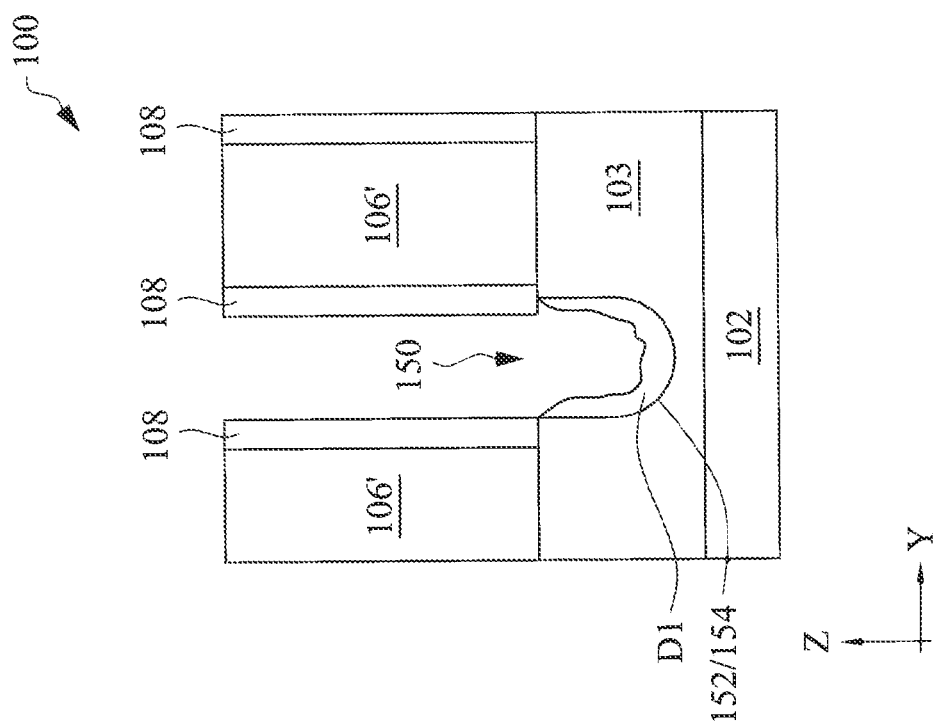
Figure 5A:
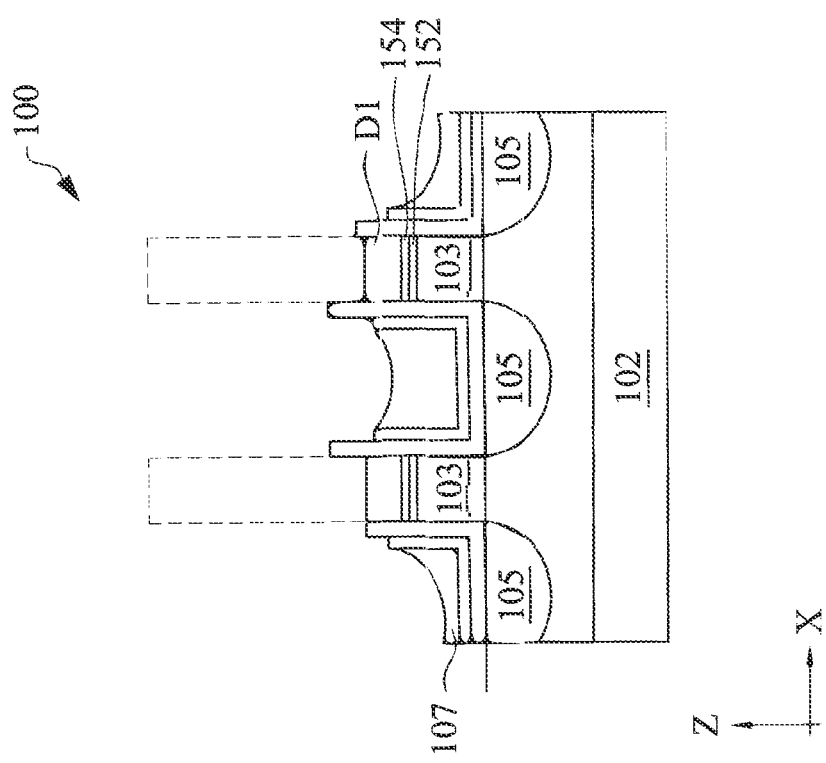

At operation 16, the method 10 (FIG. 2A) epitaxially grows the layer D1 in the S/D trenches 150, such as illustrated in FIGS. 5A and 5B. In the present embodiment, the operation 16 includes depositing a silicon seed layer 152 on the surface of the S/D trenches 150 and baking the device 100 at a high temperature to reconstruct atomic disorder. The silicon seed layer 152 may be deposited at a temperature in a range from about 650° C. to about 750° C., such as shown in FIG. 14 for the duration from t1 to t2. The baking of the device 100 may be performed at a temperature in a range from about 700° C. to about 850° C., such as shown in FIG. 14 for the duration from t2 to t3. Particularly, the temperature for the baking operation is higher than the temperature for other operations. After the baking finishes, the operation 16 deposits a silicon germanium seed layer 154 on the silicon seed layer 152. The silicon germanium seed layer 154 includes $Si_{1-x}Ge_x$ where x in a range of 5 at. % to 20 at. %. The silicon germanium seed layer 154 is deposited at a temperature (such as shown in FIG. 14 for the duration from t3 to t4) that is similar to the temperature during the deposition of the silicon seed layer 152. Subsequently, the operation 16 deposits the layer D1 over the silicon germanium seed layer 154 where the layer D1 includes p-type doped SiGe. In an embodiment, the layer D1 includes B doped $Si_{1-x}Ge_x$ where the Ge % is in a range from about 15 at. % to about 30 at. % and the B doping concentration is in a range from about 5E19 atoms/cm³ to about 5E20 atoms/cm³. The layer D1 may be formed using selective growth and etching (SGE) processes and formed at a temperature in a range from about 600° C. to about 700° C., such as shown in FIG. 14 for the duration from t4 to t5. For example, the operation 16 may supply gases such as $GeH_4$, $B_2H_4$, HCl, and $H_2SiCl_2$ into an epitaxy chamber. The operation 16 may also supply $SiH_4$ into the chamber in addition to the gases above. The ratios (such as gas flow ratios) among the gases are controlled to achieve the Ge % and B doping concentration discussed above. In an embodiment, the layers 152, 154, and D1 collectively have a thickness about 3 nm to about 10 nm along the "X" direction and a height about 10 nm to about 30 nm along the "Z" direction.

Figure 6B:
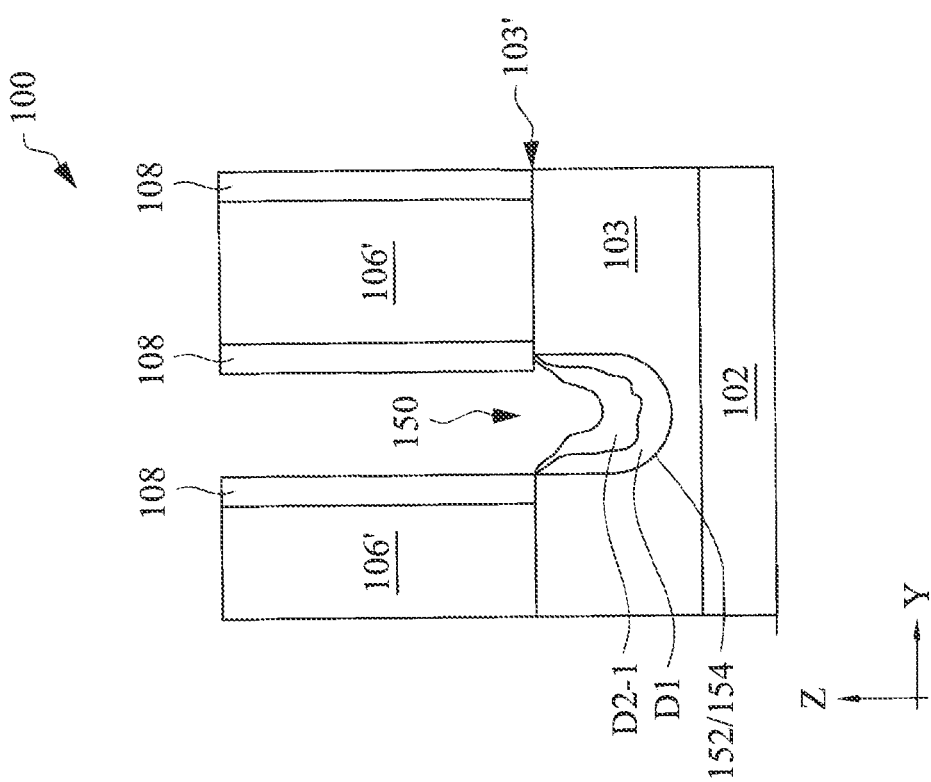
Figure 6A:
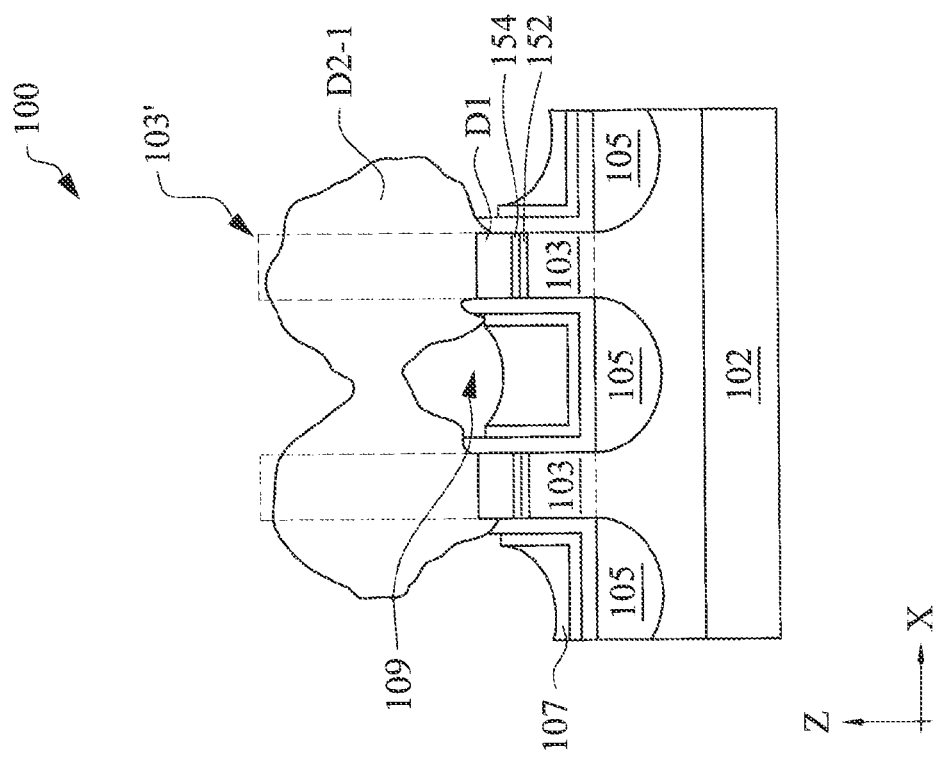

At operation 18, the method 10 (FIG. 2A) epitaxially grows the layer D2-1 in the S/D trenches 150, such as illustrated in FIGS. 6A and 6B. Referring to FIGS. 6A and 6B, the layer D2-1 grows out of the confines of the sidewall spacers 107 and expand vertically along the "Z" direction and laterally along the "X" direction. The D2-1 layers on adjacent fins 103 merge into a larger epitaxial feature, creating a gap (or air gap) 109 between the merged D2-1 layers and the fin sidewall spacers 107. However, the top surface of the layer D2-1 is kept below the top surface 103' of the semiconductor fins 103, for example, to avoid growth defects that might arise when the epitaxial growth comes in contact with the dielectric layers in the spacer 108. The Ge %, the p-type doping concentration, and the thickness of the layer D2-1 have been discussed with reference to FIGS. 1D-1 and 1D-2 above. The layer D2-1 may be formed using selective growth and etching (SGE) processes and formed at a temperature in a range from about 580° C. to about 650° C., such as shown in FIG. 14 for the duration from t5 to t6. The temperature for the operation 18 is lower than the temperature for the operation 16 to achieve a higher p-type doping (such as B doping) during the operation 18 than during the operation 16.

In an embodiment, the operation 18 controls the crystal facets, the Ge %, and the p-type doping concentration of the layer D2-1 by controlling the gas flow rates of various precursor and etching gases. For example, the operation 18 may gradually increase a gas flow rate of a gas (or a gas mixture) containing Ge (such as $GeH_4$) (such as from about 300 sccm to about 750 sccm), gradually decrease a gas flow rate of a gas (or a gas mixture) containing Si (such as $H_2SiCl_2$ and/or $SiH_4$) (such as from about 60 sccm to about 30 sccm), gradually increase a gas flow rate of a gas containing the p-type dopant (such as $B_2H_4$) (such as from about 100 sccm to about 250 sccm), and gradually increase a gas flow rate of an etching gas such as HCl (such as from about 100 sccm to about 250 sccm). By controlling the gas flow rates as discussed above, the Ge % and the dopant concentration in the layer D2-1 as shown in FIGS. 1D-1 and 1D-2 can be achieved. For example, because the gas flow rate of the gas containing Ge keeps increasing while the gas flow rate of the gas containing Si keeps decreasing, the Ge % in the layer D2-1 keeps increasing during the phases P1 and P2. At the same time, the gas flow rate of the gas containing the p-type dopant keeps increasing, resulting in a gradual increase of the dopant concentration during the phase P1. Once the p-type dopant reaches its solid solubility in the SiGe crystal (layer D2-1), it transitions into the phase P2 and its concentration in SiGe remains relatively constant or slightly decreasing even though the gas flow rate of the gas containing the p-type dopant still increases. Further, the gas flow for the etching gas such as HCl is higher in the phase P2 than in the phase P1, which helps to control the facet (or the shape) of the SiGe epitaxial growth preferentially along the SiGe [110] direction.

In another embodiment, the operation 18 controls the crystal facets, the Ge %, and the p-type doping concentration of the layer D2-1 by controlling the ratios among the gas flow rates of various precursor and etching gases. For example, the operation 18 may gradually increase a first ratio between a gas flow rate of a gas (or a gas mixture) containing Ge (such as $GeH_4$) and a gas flow rate of a gas (or a gas mixture) containing Si (such as $H_2SiCl_2$ and/or $SiH_4$) to thereby gradually increase the Ge % in the layer D2-1. For example, the operation 18 may gradually increase the first ratio from about 5 to about 25 during the growth of the layer D2-1 (both phases P1 and P2) to achieve the Ge % profile shown in FIG. 1D-1. For another example, the operation 18 may gradually decrease a second ratio between a gas flow rate of a gas (or a gas mixture) containing Ge (such as $GeH_4$) and a gas flow rate of a gas (or a gas mixture) containing the p-type dopant (such as $B_2H_4$) to thereby gradually increase the dopant concentration during the phase P1 and keep the dopant concentration relatively constant or slight decreasing during the phase P2 after the p-type dopant reaches its solid solubility in SiGe. For example, the operation 18 may gradually decrease the second ratio from about 10 to about 2 during the growth of the layer D2-1 (both phases P1 and P2) to achieve the dopant concentration profile shown in FIG. 1D-2. The operation 18 may simultaneously increases the first ratio and decreases the second ratio to achieve the Ge % profile shown in FIG. 1D-1 and the dopant concentration profile shown in FIG. 1D-2.

At operation 20, the method 10 (FIG. 2A) epitaxially grows the layer D2-2 in the S/D trenches 150, such as illustrated in FIGS. 7A and 7B. Referring to FIGS. 7A and 7B, the layer D2-2 is deposited over the layer D2-1. In the present embodiment, the operation 20 deposits the layer D2-2 without supplying etching gases. A gas flow ratio between a gas (or gas mixture) containing Ge (such as $GeH_4$) and another gas (or gas mixture) containing Si (such as $H_2SiCl_2$ and/or $SiH_4$) is kept substantially constant such that the Ge % in the deposited SiGe is substantially constant as the thickness of the epitaxial layer D2-2 increases. At the same time, a gas flow ratio between a gas containing the p-type dopant (such as $B_2H_4$) to the gas containing Ge is kept increasing so that the p-type doping concentration is kept increasing as the thickness of the epitaxial layer increases. The layer D2-2 may be formed at a temperature in a range from about 580° C. to about 650° C., such as shown in FIG. 14 for the duration from t6 to t7. As shown in FIG. 14, between the deposition of the layer D2-1 and the layer D2-2, a cleaning process (such as using HCl) may be performed at time t6 to avoid unwanted epitaxial growth and to control the shape of the S/D feature 104. In some embodiments, during the HCl cleaning, the germanium deposition gas (such as $GeH_4$) may be flowed into the epitaxy chamber to accelerate the etching. For example, Ge acts as catalyst, thereby increasing the etching rate and etching selectivity against Si. The Ge source dynamically forms a SiGe surface layer during the etching process. Ge penetrates into α-Si through diffusion, forming an α-SiGe film with high Ge concentration. Ge diffusion into c-Si is limited. The Ge %, the p-type doping concentration, and the thickness of the layer D2-2 have been discussed with reference to FIGS. 1D-1 and 1D-2 above. As shown in FIGS. 7A and 7B, the layer D2-2 almost fills up the S/D trenches 150 and the top surface of the layer D2-2 may be at the same level as or slightly higher than the top surface of the semiconductor fins 103 in an embodiment.

Figure 8A:
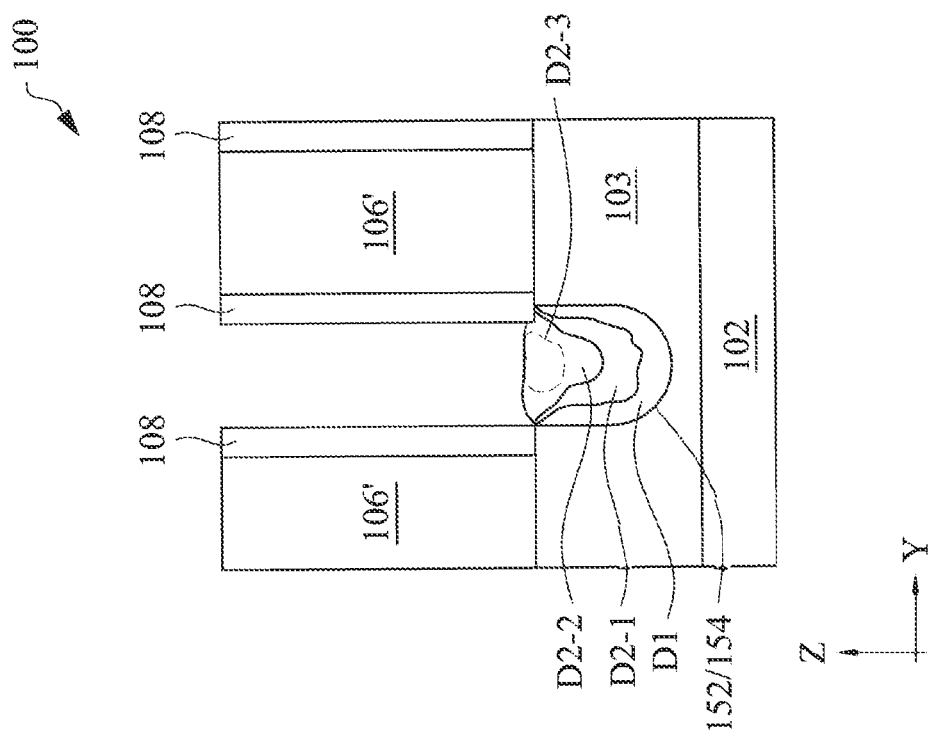
Figure 8B:
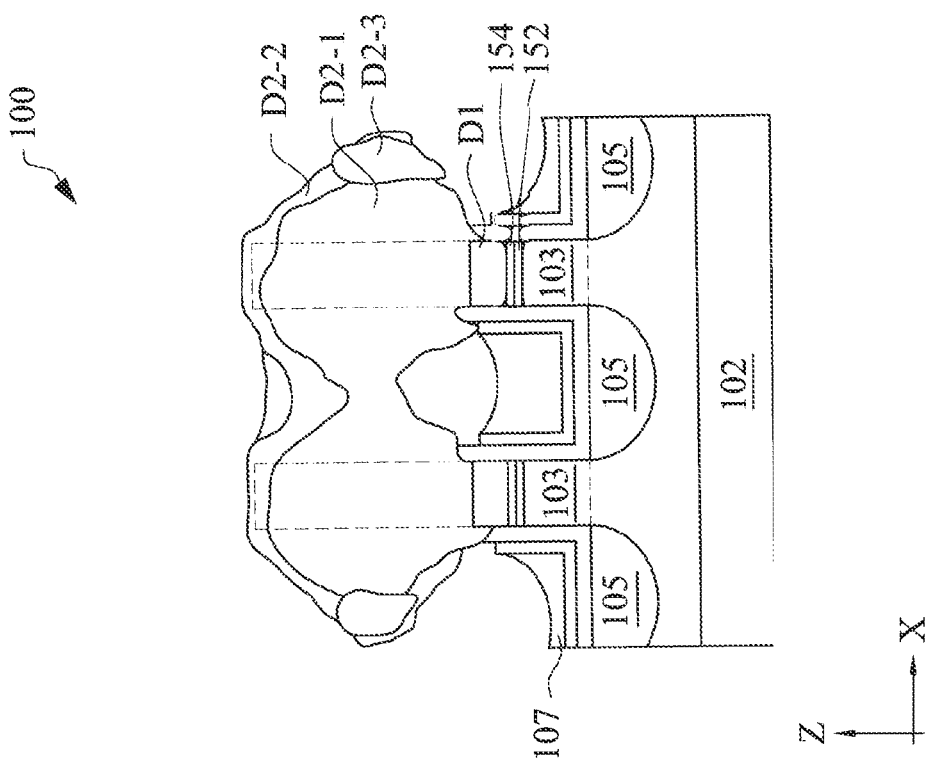

At operation 22, the method 10 (FIG. 2A) epitaxially grows the layer D2-3 over the layer D2-2, such as illustrated in FIGS. 8A and 8B. Referring to FIG. 8A, the layer D2-3 is disposed at the corners of the S/D feature 104 and extends along the SiGe [110] direction. In FIG. 8B, the layer D2-3 is offset from the center line of the fins 103 but is superimposed on the layer D2-2 for illustration purposes. The operation 22 performs SGE processes to form the layer D2-3. In an embodiment, a gas flow ratio between a gas (or gas mixture) containing Ge (such as $GeH_4$) and another gas (or gas mixture) containing Si (such as $H_2SiCl_2$ and/or $SiH_4$) is kept decreasing such that the Ge % in the deposited SiGe decreases as the thickness of the epitaxial layer D2-3 increases. In an embodiment, a gas flow ratio between a gas containing the p-type dopant (such as $B_2H_4$) to the gas containing Ge is kept increasing so that the p-type doping concentration gradually increases as the thickness of the epitaxial layer increases. During the deposition of layer D2-3, the p-type dopant (such as B) piles up along the SiGe (110) planes and creates the highest p-doping concentration in the S/D feature 104. In an embodiment, the layer D2-3 is formed at a temperature in a range from about 580° C. to about 650° C., such as shown in FIG. 14 for the duration from t7 to t8. The Ge %, the p-type doping concentration, and the thickness of the layer D2-3 have been discussed with reference to FIGS. 1D-1 and 1D-2 above.

Figure 9B:
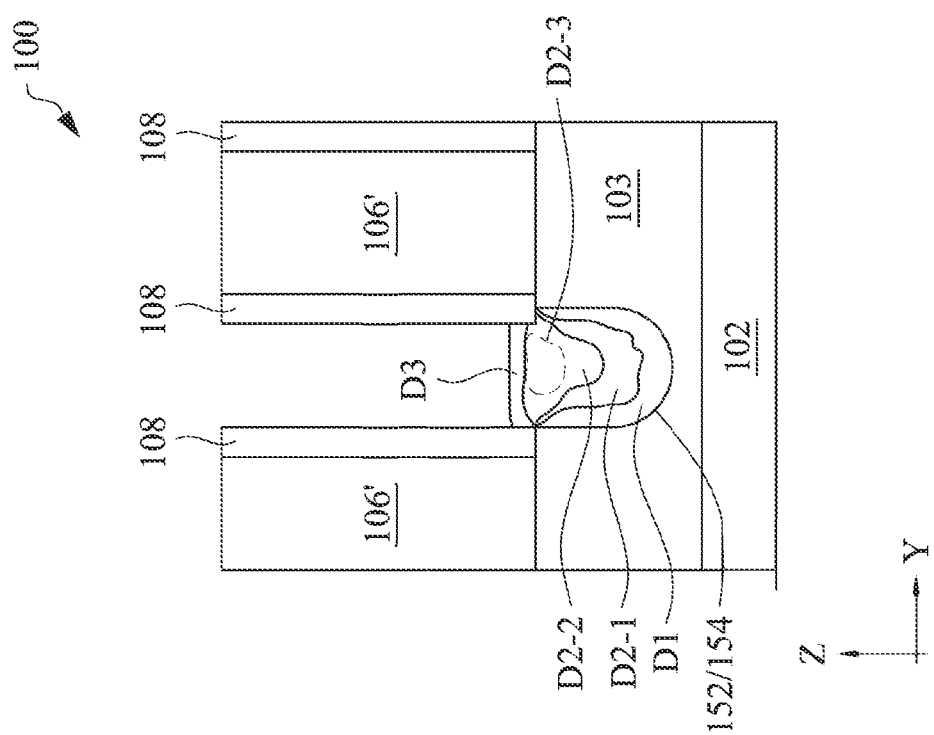
Figure 9A:
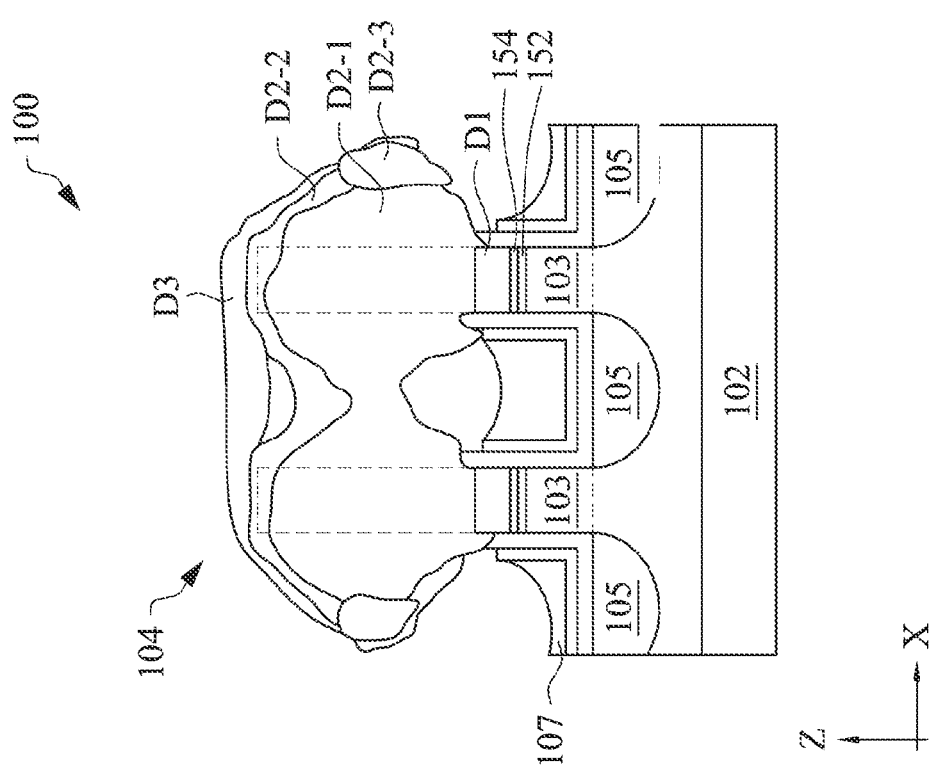

At operation 24, the method 10 (FIG. 2A) epitaxially grows the layer D3 over the layers D2-2 and D2-3, such as illustrated in FIGS. 9A and 9B. Referring to FIGS. 9A and 9B, the layer D3 is disposed at the top of the S/D feature 104 and extends above the top surface of the semiconductor fins 103. In an embodiment, before depositing the layer D3, the operation 24 performs a cleaning process (such as using HCl) (such as at time t8 in FIG. 14) to avoid unwanted epitaxial growth and to control the shape of the S/D feature 104. In some embodiments, during the HCl cleaning, the germanium deposition gas (such as $GeH_4$) may be flowed into the chamber to accelerate the etching, as discussed above. In an embodiment, the operation 24 performs cyclic deposition and etching processes (CDE) to control the shape of the S/D feature 104. For example, as illustrated in FIG. 14, the operation 24 may perform etching processes (such as using HCl) at time t9, t10, t11, and t12 and perform epitaxial growth from t8 to t9, from t9 to t10, from t10 to t11, from t11 to t12, and after t12. A gas flow ratio between a gas (or gas mixture) containing Ge (such as $GeH_4$) and another gas (or gas mixture) containing Si (such as $H_2SiCl_2$ and/or $SiH_4$) is kept substantially constant such that the Ge % in the deposited SiGe is substantially constant as the thickness of the epitaxial layer D3 increases. At the same time, a gas flow ratio between a gas containing the p-type dopant (such as $B_2H_4$) to the gas containing Ge is kept substantially constant so that the p-type doping concentration is kept substantially constant as the thickness of the epitaxial layer increases. The layer D3 may be formed at a temperature in a range from about 580° C. to about 650° C., such as shown in FIG. 14 for the duration from t8 to t12. The Ge %, the p-type doping concentration, and the thickness of the layer D3 have been discussed with reference to FIGS. 1D-1 and 1D-2 above.

At operation 26, the method 10 (FIG. 2A) forms the CESL 110 and the ILD layer 112. For example, the CESL 110 may be deposited over various surfaces of the S/D features 104, the fin sidewall spacers 107, the gate spacers 108, and the sacrificial gate stack 106'. Then, the ILD layer 112 is deposited over the CESL 110 and filling the space between the various structures. The operation 26 may perform a CMP process to planarize the top surface of the ILD layer and to expose the sacrificial gate stacks 106' for gate replacement processes. The CESL 110 may include silicon nitride ($Si_3N_4$), silicon oxynitride (SiON), silicon nitride with oxygen (O) or carbon (C) elements, and/or other materials. The CESL 110 may be formed by plasma enhanced CVD (PECVD) process and/or other suitable deposition or oxidation processes. The ILD 112 may include materials such as tetraethylorthosilicate (TEOS) formed oxide, un-doped silicate glass, or doped silicon oxide such as borophosphosilicate glass (BPSG), fluoride-doped silicate glass (FSG), phosphosilicate glass (PSG), boron doped silicon glass (BSG), and/or other suitable dielectric materials. The ILD layer 112 may be deposited by a PECVD process, a flowable CVD (FCVD) process, or other suitable deposition technique.

At operation 28, the method 10 (FIG. 2B) replaces the sacrificial gate stacks 106' with functional gate stacks 106. For example, the operation 28 may perform one or more etching processes to remove the sacrificial gate stacks 106', resulting in gate trenches, and deposit functional gate stacks 106 into the gate trenches.

Figure 10:
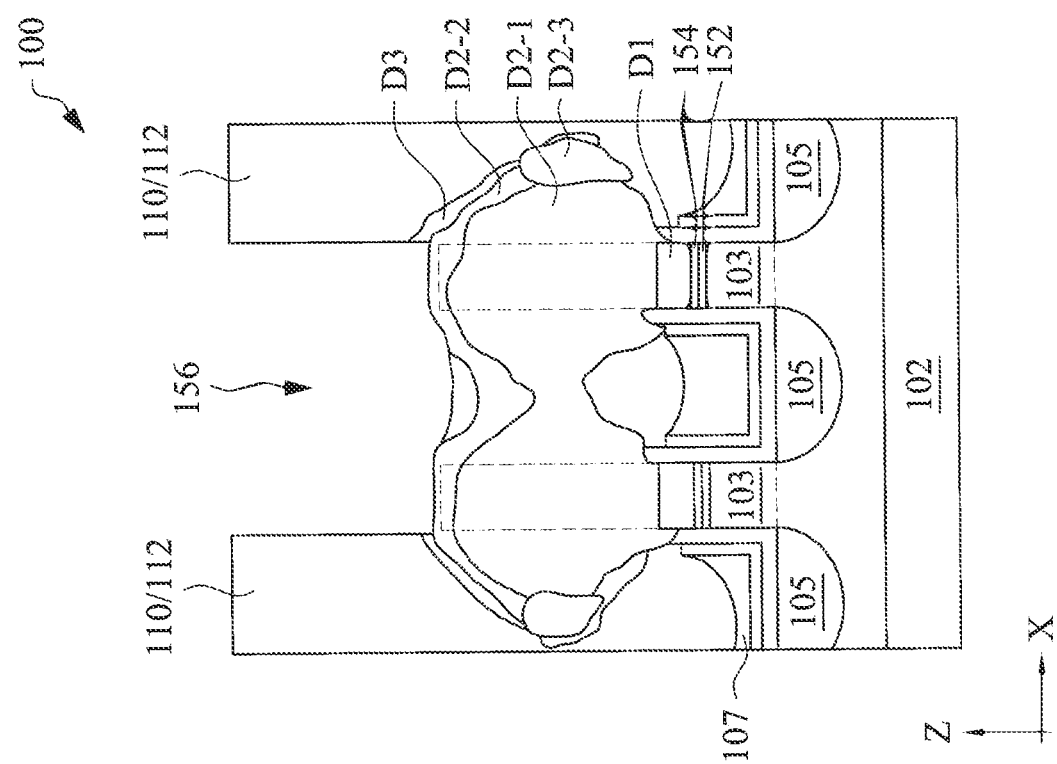

At operation 30, the method 10 (FIG. 2B) etches S/D contact holes 156 through the ILD layer 112 and the CESL 110 to expose the S/D feature 104, such as shown in FIG. 10 in an embodiment. In an embodiment, an etch mask is formed over the device 100, providing openings exposing various portions of the device 100. The openings correspond to the areas of the device 100 where S/D contacts for S/D features 104 are to be formed. Subsequently, the device 100 is etched through the openings to remove the exposed portions of the ILD layer 112 and the CESL 110, for example, using a dry etching process, a wet etching process, a reactive ion etching process, other suitable etching processes, or a combination thereof. In an embodiment, the layer D3 may be partially or completely etched by the etching process. In an embodiment, the layer D3 is about 5 nm to about 6 nm thick at the top of the S/D feature 104 while the etching process etches about 10 nm to about 15 nm into the S/D feature 104, which creates a wavy top surface for the S/D feature 104 for more contact area.

Figure 11:
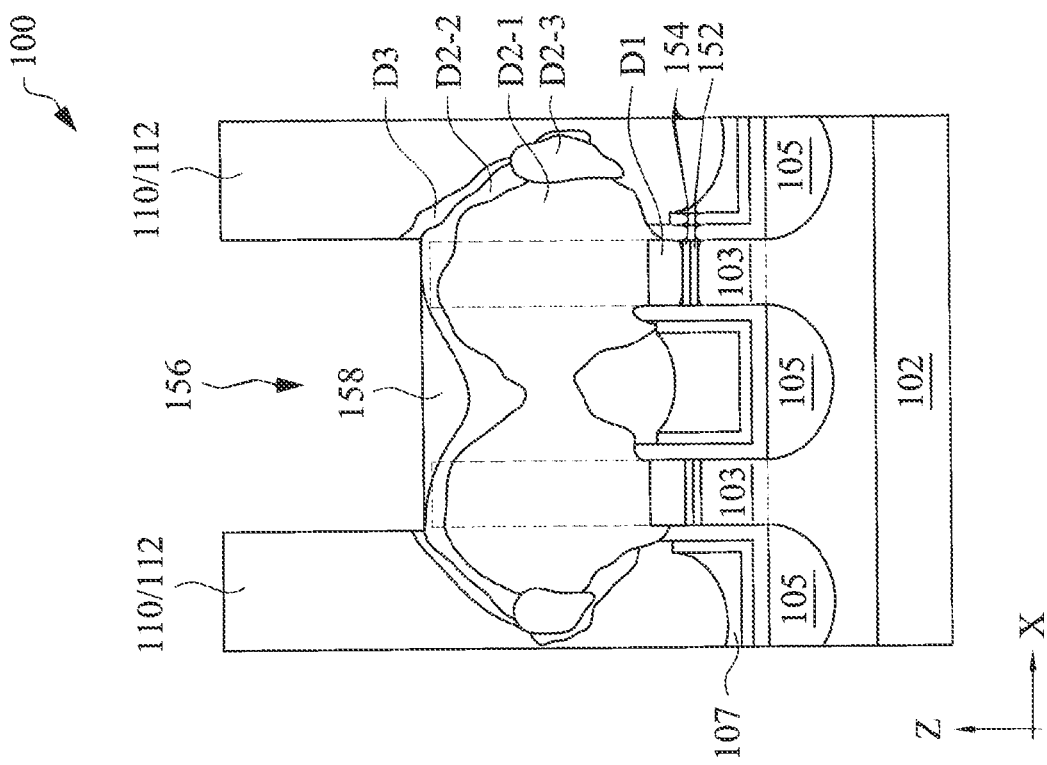

At operation 32, the method 10 (FIG. 2B) prepares a top portion 158 of the S/D feature 104 for subsequent silicide formation, such as shown in FIG. 11. In an embodiment, the operation 32 includes implanting p-type dopants, such as B, into the top portion 158 of the S/D feature 104 and annealing the device 100 to activate the dopants. The top portion 158 may have a thickness in a range of about 1 nm to about 5 nm. In an embodiment, the operation 32 includes performing Ge pre-amorphization implant (Ge PAI) to the top portion 158 of the S/D feature 104. In an embodiment, the operation 32 may perform both B implantation/activation and Ge PAI. In another embodiment, the operation 32 may perform Ge PAI without performing B implantation/activation.

Figure 12:
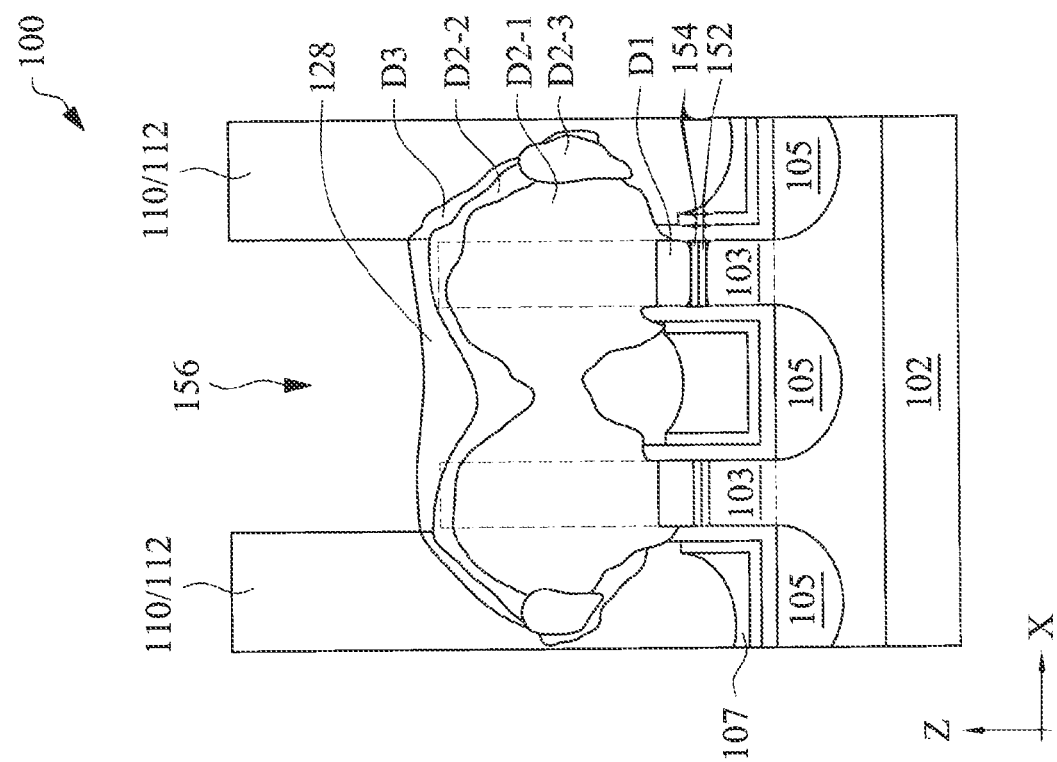

At operation 34, the method 10 (FIG. 2B) forms silicide 128 over the S/D feature 104, such as shown in FIG. 12. In an embodiment, the operation 34 includes depositing one or more metals into the contact holes 156, annealing the device 100 so that the one or more metals react with the S/D feature 104 (particularly the portion 158 of the S/D feature 104) to form the silicide feature 128, and removing the unreacted metal(s). The one or more metals may include titanium (Ti), tantalum (Ta), nickel (Ni), platinum (Pt), ytterbium (Yb), iridium (Ir), erbium (Er), cobalt (Co), or a combination thereof (e.g., an alloy of two or more metals), and may be deposited using CVD, PVD, ALD, or other suitable methods. The silicide feature 128 may include titanium germanosilicide (TiSiGe), nickel germanosilicide (NiSiGe), nickel-platinum germanosilicide (NiPtSiGe), ytterbium germanosilicide (YbSiGe), platinum germanosilicide (PtSiGe), iridium germanosilicide (IrSiGe), erbium germanosilicide (ErSiGe), cobalt germanosilicide (CoSiGe), or other suitable compounds.

Figure 13:
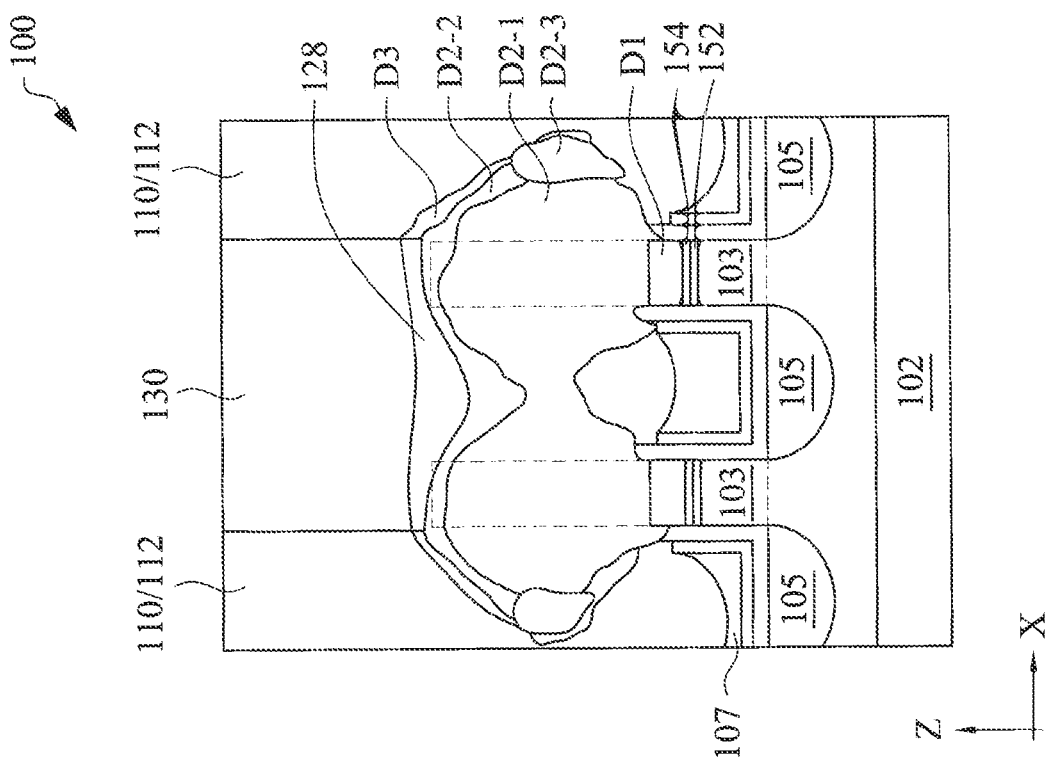

At operation 36, the method 10 (FIG. 2B) forms an S/D contact plug (or simply, S/D contact) 130 over the silicide feature 128 by depositing one or more metals or metallic compounds (e.g., TiN) in the contact hole 156. Referring to FIG. 13, the S/D contact 130 is deposited over the silicide feature 128, which interfaces with the S/D feature 104 having SiGe alloy. In embodiments, the S/D contact 130 may include tungsten (W), cobalt (Co), copper (Cu), other metals, metal nitrides such as titanium nitride (TiN), titanium aluminum nitride (TiAlN), tungsten nitride (WN), tantalum nitride (TaN), or combinations thereof, and may be formed by CVD, PVD, plating, and/or other suitable processes. A CMP process may be performed to planarize a top surface of the device 100, remove excessive portions of the metallic material(s).

At operation 38, the method 10 (FIG. 2B) performs further steps to complete the fabrication of the device 100. For example, it may perform various processes to form S/D contacts for n-type transistors, form gate contacts electrically coupled to the gate stacks 106, and form metal interconnects connecting the transistors as well as other portions of the device 100 to form a complete IC.

Although not intended to be limiting, one or more embodiments of the present disclosure provide many benefits to a semiconductor device and a formation process thereof. For example, embodiments of the present disclosure form SiGe S/D features that have relatively high boron doping at its outer portions, helping to reduce sheet resistance and contact resistance, as well as helping to resist contact hole etching process. Further, the SiGe S/D features are formed with multiple layers where the Ge % and the boron doping gradually increase to respective desired levels. Such formation process can form high quality B doped SiGe alloy with reduced crystal defects. Further, the provided subject matter can be readily integrated into existing IC fabrication flow and can be applied to many different process nodes.

In one example aspect, the present disclosure is directed to a method that includes providing a structure that includes a substrate, a semiconductor fin extending from the substrate, and a gate structure over the substrate and engaging the semiconductor fin. The method further includes etching the semiconductor fin to form a source/drain trench; and epitaxially growing a source/drain feature in the source/drain trench. The epitaxially growing of the source/drain feature includes epitaxially growing a first semiconductor layer having silicon germanium in the source/drain trench; epitaxially growing a second semiconductor layer having silicon germanium above the first semiconductor layer; epitaxially growing a third semiconductor layer having silicon germanium over the second semiconductor layer; and epitaxially growing a fourth semiconductor layer having silicon germanium and disposed at a corner portion of the source/drain feature where the source/drain feature has a largest lateral dimension. Each of the first, the second, the third, and the fourth semiconductor layers includes a p-type dopant, and the fourth semiconductor layer has a higher dopant concentration of the p-type dopant than each of the first, the second, and the third semiconductor layers.

In some embodiments of the method, the epitaxially growing of the second semiconductor layer includes increasing a first ratio between a first flow rate of a first gas containing germanium and a second flow rate of a second gas containing silicon and decreasing a second ratio between the first flow rate to a third flow rate of a third gas containing the p-type dopant. In a further embodiment, the first ratio is gradually increased from about 5 to about 25 and the second ratio is gradually decreased from about 10 to about 2.

In some embodiments of the method, the epitaxially growing of the second semiconductor layer includes gradually increasing a flow rate of a gas containing Ge, gradually decreasing a flow rate of a gas containing Si, gradually increasing a flow rate of a gas containing the p-type dopant, and gradually increasing a flow rate of an etching gas. In some embodiments of the method, the epitaxially growing of the third semiconductor layer includes keeping a flow rate of a first gas containing germanium substantially constant while gradually increasing a flow rate of a second gas containing the p-type dopant. In some embodiments of the method, the epitaxially growing of the fourth semiconductor layer includes gradually decreasing a flow rate of a first gas containing germanium and gradually increasing a flow rate of a second gas containing the p-type dopant.

In some embodiments of the method, the epitaxially growing of the source/drain feature further includes epitaxially growing a fifth semiconductor layer having silicon germanium over the third and the fourth semiconductor layers, wherein the fifth semiconductor layer includes the p-type dopant at a higher dopant concentration than the first, the second, and the third semiconductor layers. In a further embodiment, the method further includes depositing an inter-level dielectric (ILD) layer over the fifth semiconductor layer; forming a contact hole in the ILD layer, the contact hole exposing an area of the source/drain feature; and forming a silicide feature on the source/drain feature. In a further embodiment, after forming the contact hole and before forming the silicide feature, the method further includes implanting the p-type dopant to a top portion of the source/drain feature. In an embodiment, after implanting the p-type dopant to the top portion of the source/drain feature and before forming the silicide feature, the method further includes implanting germanium to the top portion of the source/drain feature.

In another example aspect, the present disclosure is directed to a semiconductor structure that includes a substrate; a semiconductor fin extending from the substrate; a source/drain feature over the semiconductor fin; and a contact plug disposed on the source/drain feature. The source/drain feature includes a first semiconductor layer having silicon germanium and disposed on the semiconductor fin, a second semiconductor layer having silicon germanium above the first semiconductor layer and extending laterally wider than the semiconductor fin, a third semiconductor layer having silicon germanium over the second semiconductor layer, and a fourth semiconductor layer having silicon germanium and disposed at a corner portion of the source/drain feature where the source/drain feature has a largest lateral dimension. Each of the first, the second, the third, and the fourth semiconductor layers includes a p-type dopant, and the fourth semiconductor layer has a higher dopant concentration of the p-type dopant than the first, the second, and the third semiconductor layers.

In an embodiment of the semiconductor structure, the p-type dopant includes boron. In another embodiment, a dopant concentration of the p-type dopant in the second semiconductor layer gradually increases and then gradually decreases as a thickness of the second semiconductor layer increases. In a further embodiment, a ratio of germanium to silicon in the second semiconductor layer gradually increases as the thickness of the second semiconductor layer increases.

In an embodiment of the semiconductor structure, a dopant concentration of the p-type dopant in the third semiconductor layer gradually increases as a thickness of the third semiconductor layer increases. In another embodiment, a dopant concentration of the p-type dopant in the fourth semiconductor layer gradually increases and a ratio of germanium to silicon in the fourth semiconductor layer gradually decreases as a thickness of the fourth semiconductor layer increases.

In yet another example aspect, the present disclosure is directed to a semiconductor structure that includes a substrate; a semiconductor fin extending from the substrate and having silicon germanium; a source/drain feature over the semiconductor fin; and a contact plug disposed on the source/drain feature. The source/drain feature includes a first semiconductor layer, a second semiconductor layer above the first semiconductor layer, a third semiconductor layer over the second semiconductor layer, and a fourth semiconductor layer disposed at a corner portion of the source/drain feature where the source/drain feature has a largest lateral dimension. Each of the first, the second, the third, and the fourth semiconductor layers includes silicon germanium doped with boron, the fourth semiconductor layer has a higher boron doping concentration than the first, the second, and the third semiconductor layers, and a boron doping concentration in the fourth semiconductor layer gradually increases as a thickness of the fourth semiconductor layer increases.

In an embodiment of the semiconductor structure, a ratio of germanium to silicon in the fourth semiconductor layer gradually decreases as the thickness of the fourth semiconductor layer increases. In another embodiment, a boron doping concentration in the third semiconductor layer gradually increases and a ratio of germanium to silicon in the third semiconductor layer remains substantially constant as a thickness of the third semiconductor layer increases. In yet another embodiment, a ratio of germanium to silicon in the second semiconductor layer gradually increases as the thickness of the second semiconductor layer increases.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a substrate;
   a semiconductor fin extending from the substrate;
   a source/drain feature over the semiconductor fin; and
   a contact plug disposed on the source/drain feature, wherein the source/drain feature includes:
   a first semiconductor layer having silicon germanium and disposed on the semiconductor fin,
   a second semiconductor layer having silicon germanium above the first semiconductor layer and extending laterally wider than the semiconductor fin,
   a third semiconductor layer having silicon germanium over the second semiconductor layer, and
   a fourth semiconductor layer having silicon germanium and disposed at a corner portion of the source/drain feature where the source/drain feature has a largest lateral dimension,
   wherein each of the first, the second, the third, and the fourth semiconductor layers includes a p-type dopant, and the fourth semiconductor layer has a higher dopant concentration of the p-type dopant than the first, the second, and the third semiconductor layers.

2. The semiconductor structure of claim 1, wherein the p-type dopant includes boron.

3. The semiconductor structure of claim 1, wherein a dopant concentration of the p-type dopant in the second semiconductor layer gradually increases and then gradually decreases as a thickness of the second semiconductor layer increases.

4. The semiconductor structure of claim 3, wherein a ratio of germanium to silicon in the second semiconductor layer gradually increases as the thickness of the second semiconductor layer increases.

5. The semiconductor structure of claim 1, wherein a dopant concentration of the p-type dopant in the third semiconductor layer gradually increases as a thickness of the third semiconductor layer increases.

6. The semiconductor structure of claim 1, wherein a dopant concentration of the p-type dopant in the fourth semiconductor layer gradually increases and a ratio of germanium to silicon in the fourth semiconductor layer gradually decreases as a thickness of the fourth semiconductor layer increases.

7. The semiconductor structure of claim 1, wherein the semiconductor fin includes a base portion and an upper portion on the base portion, the base portion of semiconductor fin and the substrate include a same material, and the upper portion of the semiconductor fin includes a different material than the base portion of the semiconductor fin, wherein the source/drain feature is disposed on the upper portion of the semiconductor fin.

8. The semiconductor structure of claim 7, wherein the base portion of the semiconductor fin includes silicon and the upper portion of the semiconductor fin includes silicon germanium.

9. A semiconductor structure, comprising:
a substrate;
a semiconductor fin extending from the substrate and having silicon germanium;
a source/drain feature over the semiconductor fin; and
a contact plug disposed on the source/drain feature, wherein the source/drain feature includes a first semiconductor layer, a second semiconductor layer above the first semiconductor layer, a third semiconductor layer over the second semiconductor layer, and a fourth semiconductor layer disposed at a corner portion of the source/drain feature where the source/drain feature has a largest lateral dimension,
wherein each of the first, the second, the third, and the fourth semiconductor layers includes silicon germanium doped with boron, the fourth semiconductor layer has a higher boron doping concentration than the first, the second, and the third semiconductor layers, and a boron doping concentration in the fourth semiconductor layer gradually increases as a thickness of the fourth semiconductor layer increases.

10. The semiconductor structure of claim 9, wherein a ratio of germanium to silicon in the fourth semiconductor layer gradually decreases as the thickness of the fourth semiconductor layer increases.

11. The semiconductor structure of claim 9, wherein a boron doping concentration in the third semiconductor layer gradually increases and a ratio of germanium to silicon in the third semiconductor layer remains substantially constant as a thickness of the third semiconductor layer increases.

12. The semiconductor structure of claim 9, wherein a ratio of germanium to silicon in the second semiconductor layer gradually increases as the thickness of the second semiconductor layer increases.

13. The semiconductor structure of claim 12, wherein a boron concentration in the second semiconductor layer gradually increases and then gradually decreases as a thickness of the second semiconductor layer increases.

14. A semiconductor structure, comprising:
a substrate;
a semiconductor fin extending from the substrate, wherein the semiconductor fin includes a base portion and an upper portion on the base portion, the upper portion of the semiconductor fin includes silicon germanium, the base portion of the semiconductor fin includes a different material than the upper portion of the semiconductor fin;
a source/drain feature over the semiconductor fin; and
a contact plug disposed on the source/drain feature, wherein the source/drain feature includes a first semiconductor layer, a second semiconductor layer above the first semiconductor layer, a third semiconductor layer over the second semiconductor layer, and a fourth semiconductor layer disposed at corners of the source/drain feature,
wherein each of the first, the second, the third, and the fourth semiconductor layers includes silicon germanium doped with a p-type dopant, the fourth semiconductor layer has a higher doping concentration of the p-type dopant than the first, the second, and the third semiconductor layers, and a dopant concentration of the p-type dopant in the second semiconductor layer gradually increases and then gradually decreases as a thickness of the second semiconductor layer increases.

15. The semiconductor structure of claim 14, wherein the p-type dopant includes boron.

16. The semiconductor structure of claim 14, wherein a ratio of germanium to silicon in the second semiconductor layer gradually increases as the thickness of the second semiconductor layer increases.

17. The semiconductor structure of claim 14, wherein a dopant concentration of the p-type dopant in the third semiconductor layer gradually increases as a thickness of the third semiconductor layer increases.

18. The semiconductor structure of claim 17, wherein a ratio of germanium to silicon in the third semiconductor layer remains substantially constant as the thickness of the third semiconductor layer increases.

19. The semiconductor structure of claim 14, wherein a doping concentration of the p-type dopant in the fourth semiconductor layer gradually increases as a thickness of the fourth semiconductor layer increases.

20. The semiconductor structure of claim 19, wherein a ratio of germanium to silicon in the fourth semiconductor layer gradually decreases as the thickness of the fourth semiconductor layer increases.

* * * * *